United States Patent
Ishida

(10) Patent No.: US 11,984,502 B2
(45) Date of Patent: May 14, 2024

(54) SEMICONDUCTOR DEVICE WITH SUPPRESSION OF DECREASE OF WITHSTAND VOLTAGE, AND METHOD FOR MANUFACTURING THE SEMICONDUCTOR DEVICE

(71) Applicant: ROHM CO., LTD., Kyoto (JP)

(72) Inventor: Takeshi Ishida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/797,295

(22) PCT Filed: Mar. 3, 2021

(86) PCT No.: PCT/JP2021/008083
§ 371 (c)(1),
(2) Date: Aug. 3, 2022

(87) PCT Pub. No.: WO2021/182211
PCT Pub. Date: Sep. 16, 2021

(65) Prior Publication Data
US 2023/0045793 A1   Feb. 16, 2023

(30) Foreign Application Priority Data

Mar. 13, 2020  (JP) ................................ 2020-044368

(51) Int. Cl.
*H01L 29/78*   (2006.01)
*H01L 23/522*  (2006.01)
*H01L 29/06*   (2006.01)

(52) U.S. Cl.
CPC ...... *H01L 29/7818* (2013.01); *H01L 23/5222* (2013.01); *H01L 29/0615* (2013.01)

(58) Field of Classification Search
CPC ............. H01L 29/7818; H01L 23/5222; H01L 29/0615; H01L 29/404; H01L 29/7823;
(Continued)

(56) References Cited

U.S. PATENT DOCUMENTS

2003/0001206 A1* 1/2003 Negoro ............... H01L 29/7801
  257/E21.639
2006/0220099 A1* 10/2006 Kikuchi .............. H01L 29/7816
  257/E29.116

(Continued)

FOREIGN PATENT DOCUMENTS

JP   H04-127573 A   4/1992
JP   2002-314066 A  10/2002
(Continued)

OTHER PUBLICATIONS

International Search Report for PCT/JP2021/008083, dated Jun. 8, 2021.
(Continued)

*Primary Examiner* — Shahed Ahmed
(74) *Attorney, Agent, or Firm* — Rabin & Berdo, P.C.

(57) ABSTRACT

A semiconductor device 1 includes a base body 3 that includes a p type substrate 4 and an n type semiconductor layer 5 formed on the p type substrate 4 and includes an element region 2 having a transistor 40 with the n type semiconductor layer as a drain, a p type element isolation region 7 that is formed in a surface layer portion of the base body such as to demarcate the element region, and a conductive wiring 25 that is disposed on a peripheral edge portion of the element region and is electrically connected to the n type semiconductor layer. The transistor includes an n$^+$ type drain contact region 14 that is formed in a surface layer portion of the n type semiconductor layer in the peripheral edge portion of the element region. The conductive wiring is disposed such as to cover at least a portion of an element termination region 30 between the n$^+$ type drain contact region and the p type element isolation region.

13 Claims, 23 Drawing Sheets

(58) Field of Classification Search
CPC . H01L 29/0692; H01L 29/086; H01L 21/761; H01L 29/0878; H01L 29/42368; H01L 29/66681–66704; H01L 29/7816–7826; H01L 21/768–76898; H01L 29/66568–66659; H01L 23/522–53295
See application file for complete search history.

(56) References Cited

U.S. PATENT DOCUMENTS

| | | | |
|---|---|---|---|
| 2015/0115360 A1 | 4/2015 | Kubo | |
| 2017/0025532 A1* | 1/2017 | Mori | .................. H01L 29/7835 |

FOREIGN PATENT DOCUMENTS

| | | | |
|---|---|---|---|
| JP | 2007-180244 A | 7/2007 |
| JP | 2012-156205 A | 8/2012 |
| WO | 2012/127960 A1 | 9/2012 |

OTHER PUBLICATIONS

Written Opinion of the International Searching Authority for PCT/JP2021/008083, dated Jun. 8, 2021.

* cited by examiner

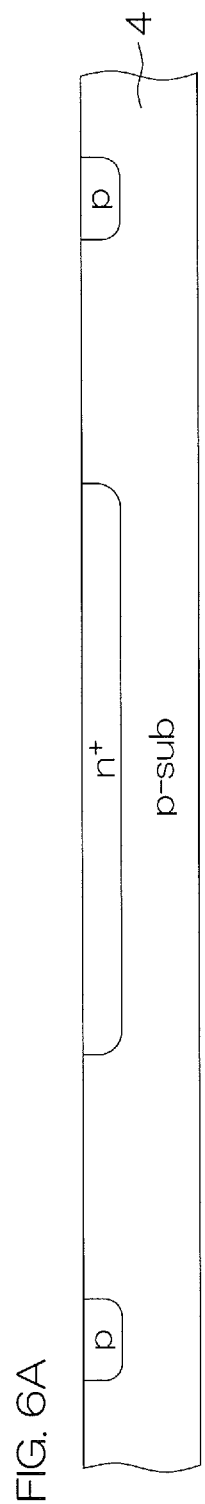

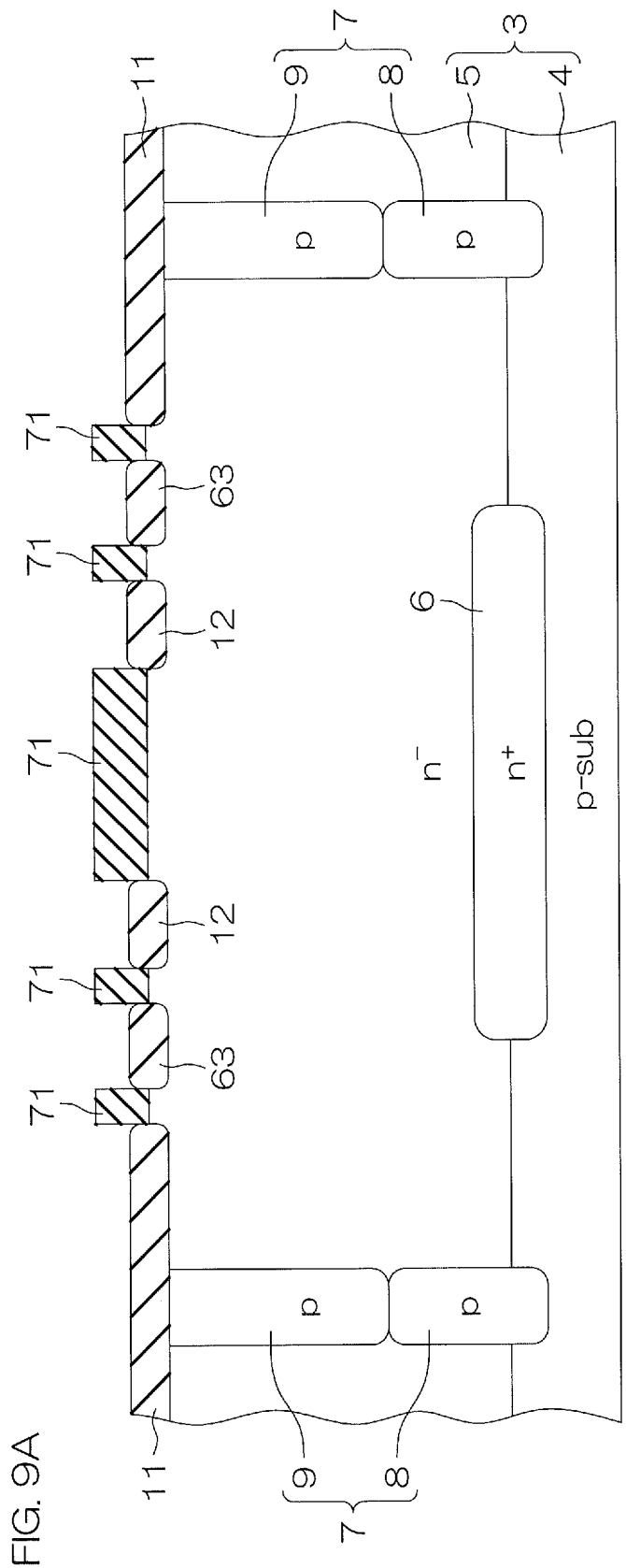

SEMICONDUCTOR DEVICE WITH SUPPRESSION OF DECREASE OF WITHSTAND VOLTAGE, AND METHOD FOR MANUFACTURING THE SEMICONDUCTOR DEVICE

TECHNICAL FIELD

The present invention relates to a semiconductor device that includes a transistor such as a DMOS (diffused metal oxide semiconductor) transistor, etc., and a method for manufacturing the same.

BACKGROUND ART

Patent Literature 1discloses a semiconductor device including a p type element isolation region (p type well) that isolates an element region and a DMOS transistor that is formed in the element region. The semiconductor device includes a source region and a drain region that are selectively formed on a front surface of an n type epitaxial layer (n type well) of a p type substrate and a gate electrode that is formed via a gate oxide film on a silicon substrate.

CITATION LIST

Patent Literature

Patent Literature 1: Japanese Patent Application Publication No. 2012-156205

SUMMARY OF INVENTION

Technical Problem

With a semiconductor device having an element isolation structure as in Patent Literature 1, a DMOS transistor is mounted together with other elements at times. With such a semiconductor device, not only wirings that are electrically connected to the DMOS transistor but a plurality of wirings (hereinafter referred to as "other wirings") that are electrically connected to the other elements besides the DMOS transistor (hereinafter referred to as "other elements") are formed. Various voltages are then applied to the plurality of other wirings in accordance with the corresponding other elements.

Therefore, with the DMOS transistor of Patent Literature 1, an equipotential distribution when a reverse voltage is applied to a parasitic diode present between the n type epitaxial layer and the p type element isolation region may be disturbed and a withstand voltage may decrease due to influence of potentials from the other wirings.

An object of the present invention is to provide a semiconductor device with which withstand voltage decrease due to influence of potentials of other wirings can be suppressed.

Solution to Problem

A preferred embodiment of the present invention provides a semiconductor device including a base body that includes a p type substrate and an n type semiconductor layer formed on the p type substrate and includes an element region having a transistor with the n type semiconductor layer as a drain, a p type element isolation region that is formed in a surface layer portion of the base body such as to demarcate the element region, and a conductive wiring that is disposed on a peripheral edge portion of the element region and is electrically connected to the n type semiconductor layer and with which the transistor includes an n type drain contact region that is formed in a surface layer portion of the n type semiconductor layer in the peripheral edge portion of the element region and the conductive wiring is disposed such as to cover at least a portion of an element termination region between the n type drain contact region and the p type element isolation region.

With the present arrangement, withstand voltage decrease due to influence of potentials of other wirings can be suppressed.

In the preferred embodiment of the present invention, a drain wiring that is electrically connected to the n type drain contact region is included, the drain wiring has an extension portion that extends into the element termination region in plan view, and the conductive wiring is constituted of the extension portion.

In the preferred embodiment of the present invention, the n type drain contact region and the drain wiring are respectively formed to endless shapes in plan view and the extension portion is formed over an entire length of the drain wiring such as to surround the n type drain contact region in plan view.

In the preferred embodiment of the present invention, in the element termination region, an n type contact region for the conductive wiring is formed in a surface layer portion of the n type semiconductor layer and the conductive wiring is electrically connected to the n type contact region via a conductive member.

In the preferred embodiment of the present invention, the n type drain contact region is formed to an endless shape in plan view and the n type contact region and the conductive wiring are respectively formed to endless shapes such as to surround the n type drain contact region in plan view.

In the preferred embodiment of the present invention, a drain wiring that is electrically connected to the n type drain contact region is included and the conductive wiring is connected to the drain wiring via a conductive member.

In the preferred embodiment of the present invention, the conductive wiring is formed on the n type semiconductor layer via an insulating layer inside the element termination region, the drain wiring has an overlapping portion that overlaps with a portion of the conductive wiring in plan view, and a lower surface of the overlapping portion and an upper surface of the conductive wiring are electrically connected by the conductive member.

In the preferred embodiment of the present invention, the n type drain contact region and the drain wiring are formed to endless shapes in plan view, the conductive wiring is formed to an endless shape such as to surround the n type drain contact region in plan view, the drain wiring has the overlapping portion at an outer peripheral edge portion thereof, and the lower surface of the overlapping portion and an inner peripheral edge portion of the upper surface of the conductive wiring are electrically connected by the conductive member.

In the preferred embodiment of the present invention, the conductive wiring is constituted of polysilicon.

In the preferred embodiment of the present invention, an n type embedded layer is formed in a central portion of the element region in plan view such as to cross over a boundary between the p type substrate and the n type semiconductor layer.

In the preferred embodiment of the present invention, the p type element isolation region is formed to an endless shape that surrounds the element region in plan view and the n type drain contact region is formed to an endless shape along the p type element isolation region in plan view.

In the preferred embodiment of the present invention, the transistor includes a p type well region that is formed in a surface layer portion of the n type semiconductor layer, an n type source region that is formed in a surface layer portion of the p type well region, an n type source contact region that is formed in a surface layer portion of the n type source region and is higher in n type impurity concentration than the n type source region, and an n type drain region that is formed in the surface layer portion of the n type semiconductor layer to an endless shape such as to surround the p type well region and the n type drain contact region is formed in a surface layer portion of the n type drain region such as to surround the p type well region and is higher in n type impurity concentration than the n type drain region.

In the preferred embodiment of the present invention, the transistor further includes a gate insulating film that is formed such as to cover a channel region between the source contact region and the drain contact region and a gate electrode that is formed on the gate insulating film and opposes the channel region via the gate insulating film.

In the preferred embodiment of the present invention, a source wiring that is electrically connected to the n type source contact region is included.

The aforementioned as well as yet other objects, features, and effects of the present invention will be made clear by the following description of the preferred embodiments, with reference to the accompanying drawings.

BRIEF DESCRIPTION OF DRAWINGS

FIG. 6A is a sectional view of an example of a manufacturing process of the semiconductor device shown in FIG. 1 and FIG. 2 and is a sectional view corresponding to the section plane of FIG. 2.

FIG. 9A is a sectional view of an example of a manufacturing process of the semiconductor device shown in FIG. 7 and FIG. 8 and is a sectional view corresponding to the section plane of FIG. 8.

DESCRIPTION OF EMBODIMENTS

Figure 1:
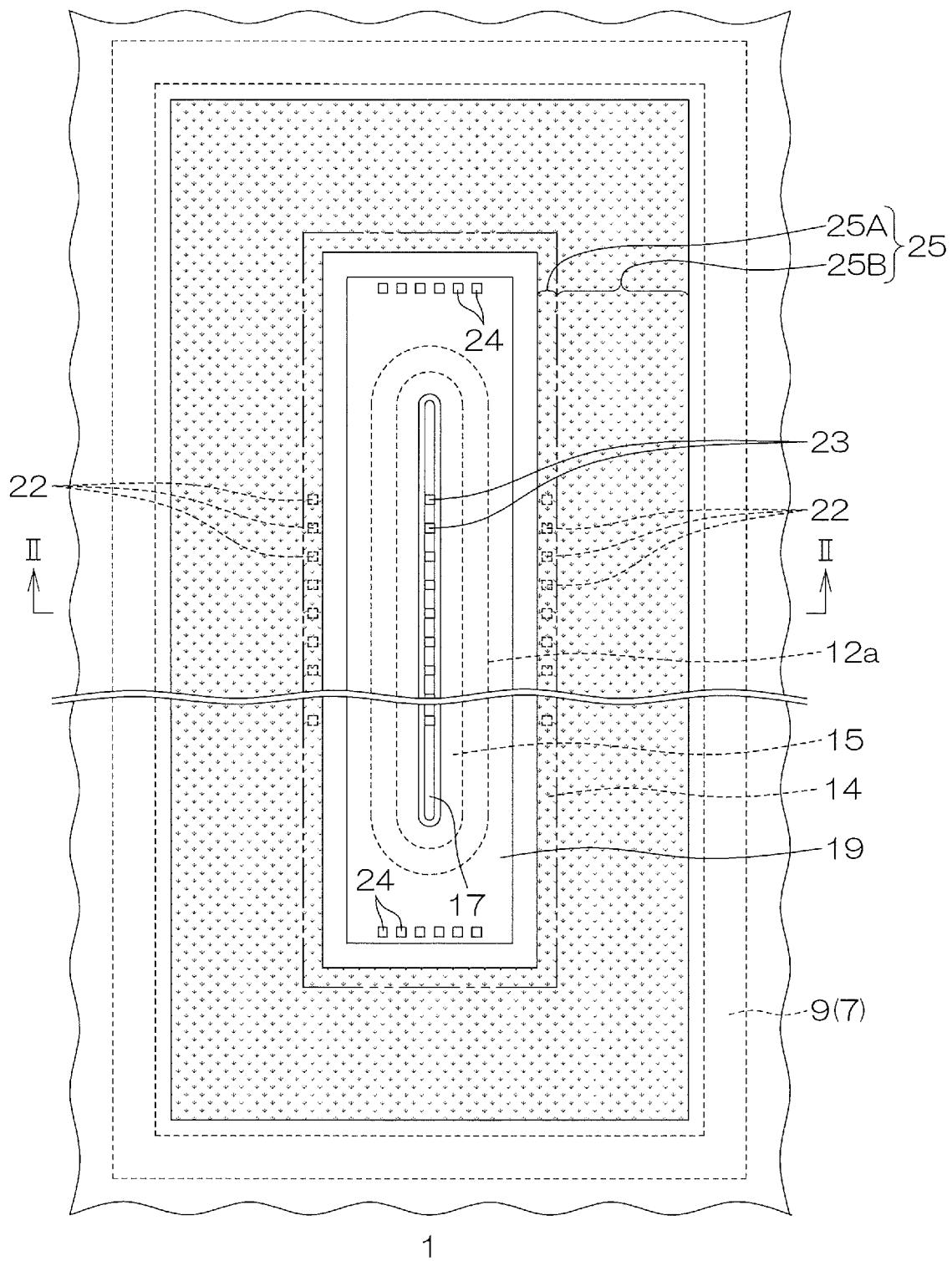
FIG. 1 is an illustrative plan view for describing the arrangement of a semiconductor device according to a first preferred embodiment of the present invention.
Figure 2:
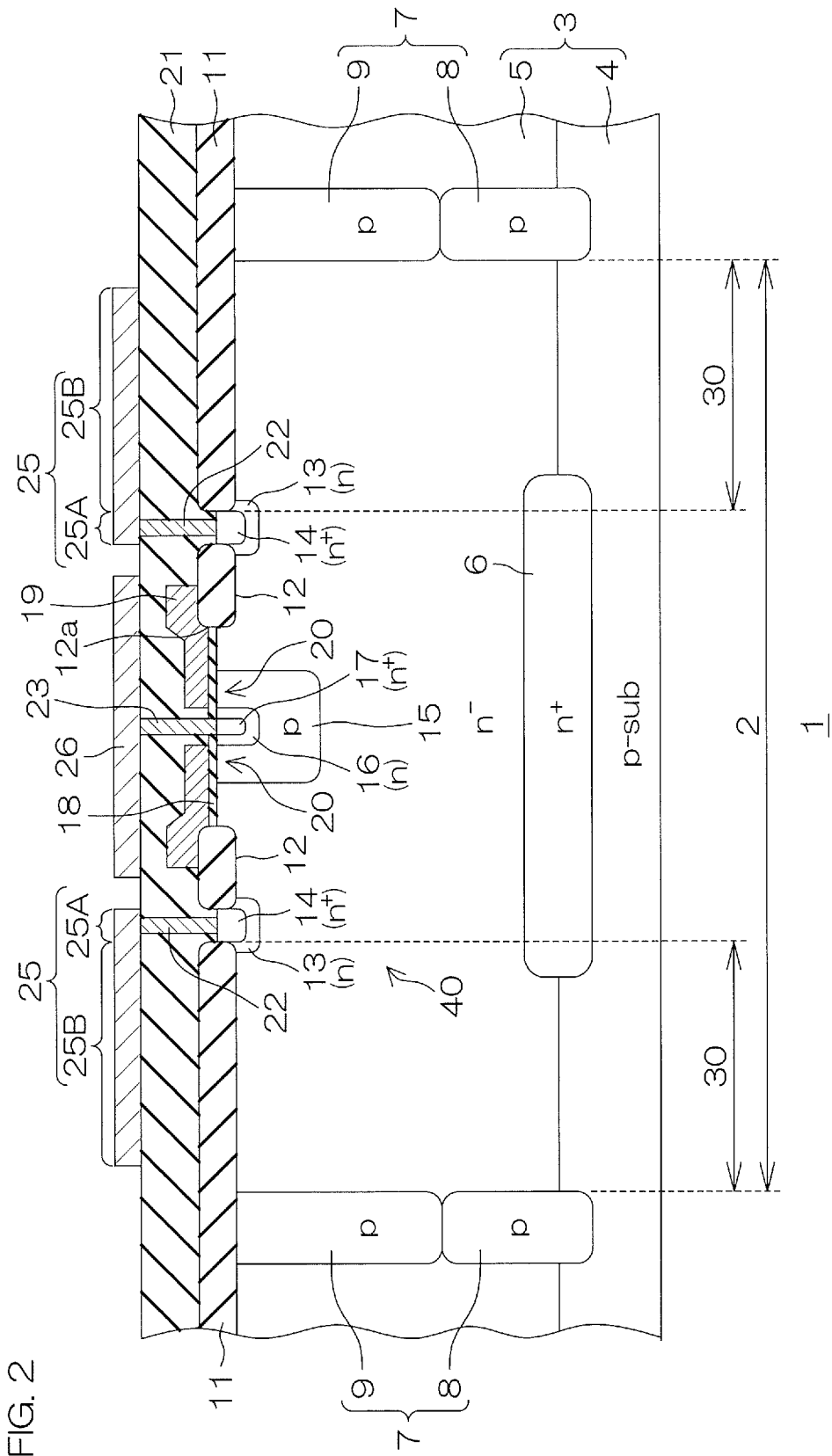
FIG. 2 is an illustrative sectional view taken along line II-II of FIG. 1.

FIG. 1 is an illustrative plan view for describing the arrangement of a semiconductor device according to a first preferred embodiment of the present invention. FIG. 2 is an illustrative sectional view taken along line II-II of FIG. 1. In FIG. 1, an interlayer insulating film 21 and a source wiring 26 shown in FIG. 2 are omitted. However, a drain wiring 25 shown in FIG. 2 is illustrated in FIG. 1.

In the following, a right-left direction of the paper surface of FIG. 1 shall be referred to as the lateral direction and an up-down direction of the paper surface of FIG. 1 shall be referred to as the longitudinal direction.

The semiconductor device 1 includes a base body 3. The base body 3 includes a p type semiconductor substrate 4 and an n⁻ type epitaxial layer 5 that is formed on the p type semiconductor substrate 4. In this preferred embodiment, the p type semiconductor substrate 4 is a silicon substrate. The p type semiconductor substrate 4 is an example of a "p type substrate" of the present invention and the n⁻ type epitaxial layer 5 is an example of an "n type semiconductor layer" of the present invention.

A film thickness of the n⁻ type epitaxial layer 5 is, for example, approximately 3.0 μm to 10 μm. A p type element isolation region 7 that demarcates an element region 2 is formed in a surface layer portion of the base body 3. In this preferred embodiment, the element region 2 has a quadrilateral shape that is long in the longitudinal direction in plan view. A DMOS transistor 40 with the n⁻ type epitaxial layer 5 as a drain is formed in the element region 2.

The p type element isolation region 7 is of endless shape in plan view. Although in this preferred embodiment, the p type element isolation region 7 is of rectangular annular shape in plan view, it may instead be of circular annular shape, elliptical annular shape, or other endless shape. The p type element isolation region 7 includes a lower isolation region 8 that is connected to the p type semiconductor substrate and an upper isolation region 9 that is formed on the lower isolation region 8.

The element region 2 constituted of a portion of the n⁻ type epitaxial layer 5 that is surrounded by the p type element isolation region 7 on the p type semiconductor substrate 4 is thereby demarcated in the base body 3. Although not illustrated, the p type element isolation region 7 and the p type semiconductor substrate 4 are grounded.

In the element region 2, an $n^+$ type embedded layer 6 that is higher in impurity concentration than the $n^-$ type epitaxial layer 5 is selectively formed across the p type semiconductor substrate 4 and the n– type epitaxial layer 5 in a boundary portion between the p type semiconductor substrate 4 and the n– type epitaxial layer 5. The $n^+$ type embedded layer 6 is formed in a central region surrounded by a peripheral edge portion of the element region 2 in plan view. A film thickness of the $n^+$ type embedded layer 6 is, for example, approximately 2.0 μm to 10.0 μm.

Also, in the base body 3, an element region (not shown) in which another element differing from the DMOS transistor 40 inside the element region 2 is formed is demarcated in an outer peripheral region of the element region 2.

A field insulating film 11 of endless shape in plan view is formed on a front surface of the p type element isolation region 7. The field insulating film 11 is formed to a quadrilateral annular shape in plan view such as to surround a region surrounded by the peripheral edge portion of the element region 2. The field insulating film 11 is wider than the p type element isolation region 7 and is formed such as to completely cover the p type element isolation region 7. The field insulating film 11 is, for example, a LOCOS film that is formed by selectively oxidizing a front surface of the $n^-$ type epitaxial layer 5.

The DMOS transistor 40 includes an n type drain region 13 and a p type well region 15 that are formed at an interval from each other in a surface layer portion of the $n^-$ type epitaxial layer 5. In this preferred embodiment, the p type well region 15 is, in plan view, of quadrilateral shape that is elongate in the longitudinal direction and formed in a central portion in the lateral direction of the element region 2.

The n type drain region 13 has a higher impurity concentration than the $n^-$ type epitaxial layer 5. The n type drain region 13 is formed to an endless shape such as to surround the p type well region 15 in plan view. In this preferred embodiment, the n type drain region 13 is formed to a quadrilateral annular shape along the field insulating film 11 in plan view. An $n^+$ type drain contact region 14 having a higher impurity concentration than the n type drain region 13 is formed in a surface layer portion of the n type drain region 13.

An n type source region 16 having a higher impurity concentration than the $n^-$ type epitaxial layer 5 is formed in a surface layer portion of the p type well region 15. An $n^+$ type source contact region 17 having a higher impurity concentration than the n type source region 16 is formed in a surface layer portion of the n type source region 16.

The n type source region 16 is formed, for example, with the same concentration and at the same depth as the n type drain region 13. An outer peripheral edge of the $n^+$ type source contact region 17 is disposed at an interval inward from an outer peripheral edge of the p type well region 15. The $n^+$ type source contact region 17 is formed, for example, with the same concentration and at the same depth as the $n^+$ type drain contact region 14.

On the front surface of the $n^-$ type epitaxial layer 5, a field insulating film 12 of quadrilateral annular shape in plan view is formed in a portion between the $n^+$ type drain contact region 14 and the p type well region 15. The field insulating film 12 is a LOCOS film that is formed in the same step as the field insulating film 11 described above. In FIG. 1, an inner peripheral edge of the field insulating film 12 is indicated by a reference sign 12a.

The inner peripheral edge 12a of the field insulating film 12 is disposed at an interval outward from the outer peripheral edge of the p type well region 15 and an outer peripheral edge of the field insulating film 12 is disposed on an inner peripheral edge of the $n^+$ type drain contact region 14. The $n^+$ type drain contact region 14 is formed in a region sandwiched by the outer peripheral edge of the field insulating film 12 and an inner peripheral edge of the field insulating film 11.

Also, on the front surface of the $n^-$ type epitaxial layer 5, a gate insulating film 18 is formed such as to extend across the $n^-$ type epitaxial layer 5 and the p type well region 15. The gate insulating film 18 is formed to a quadrilateral annular shape such as to surround the $n^+$ type source contact region 17 in plan view. Also, a gate electrode 19 is formed on the gate insulating film 18. The gate electrode 19 is formed to a quadrilateral annular shape such as to surround the n type source region 16 in plan view. The gate electrode 19 is formed such as to selectively cover a portion of the gate insulating film 18 and a portion of the field insulating film 12.

The gate electrode 19 is constituted, for example, of polysilicon. The gate insulating film 18 is, for example, a silicon oxide film that is formed by oxidizing the front surface of the $n^-$ type epitaxial layer 5.

A region in which the gate electrode 19 opposes the p type well region 15 via the gate insulating film 18 is a channel region 20 of the DMOS transistor 40. Forming of a channel in the channel region 20 is controlled by the gate electrode 19.

The interlayer insulating film 21 is formed such as to cover the entire element region 2. The interlayer insulating film 21 is formed, for example, of an insulating film such as an oxide film, a nitride film, etc.

Drain contact plugs 22, source contact plugs 23, and gate contact plugs 24 are embedded in the interlayer insulating film 21. Lower ends of the drain contact plugs 22 are electrically connected to the $n^+$ type drain contact region 14. Lower ends of the source contact plugs 23 are electrically connected to the $n^+$ type source contact region 17. The gate contact plugs 24 are electrically connected to the gate electrode 19.

The drain wiring 25, the source wiring 26, and a gate wiring (not shown) are formed on the interlayer insulating film 21. In FIG. 1, a region of the drain wiring 25 is indicated as a dot-hatched region. The drain wiring 25 is electrically connected to the $n^+$ type drain contact region 14 via the plurality of drain contact plugs 22. The source wiring 26 is electrically connected to the $n^+$ type source contact region 17 via the plurality of source contact plugs 23. The gate wiring is electrically connected to the gate electrode 19 via the plurality of gate contact plugs 24.

Although not illustrated in FIG. 1, the source wiring 26 has a quadrilateral shape that is long in the longitudinal direction and covers a length intermediate portion between both end portions of the gate electrode 19 in plan view. A plurality of locations of a width central portion of the source wiring 26 are electrically connected to the n+ type source contact region 17 via the plurality of source contact plugs 23. The gate wiring is electrically connected to both end portions of the gate electrode 19 via the plurality of gate contact plugs 24.

The drain wiring 25 is formed to a quadrilateral annular shape such as to surround the field insulating film 12 in plan view. An inner peripheral edge of the drain wiring 25 is located substantially directly above the inner peripheral edge of the n+ type drain contact region 14. An outer peripheral edge of the drain wiring 25 is located further outward than an outer peripheral edge of the n⁺ type drain contact region 14. The drain wiring 25 is constituted of a main wiring portion 25A that is disposed directly above the n⁺ type drain contact region 14 and an extension portion 25B that extends outward from an outer peripheral edge of the main wiring portion 25A. In the first preferred embodiment, the extension portion 25B constitutes a "conductive wiring" (also referred to hereinafter at times as "withstand voltage improving wiring") of the present invention.

The extension portion (withstand voltage improving wiring) 25B has a quadrilateral annular shape and extends from the outer peripheral edge of the n⁺ type drain contact region 14 toward the p type element isolation region 7 at an outer side thereof in plan view. In this preferred embodiment, the extension portion 25B extends from the outer peripheral edge of the n⁺ type drain contact region 14 to substantially a width center of a portion between the outer peripheral edge of the n⁺ type drain contact region 14 and an inner peripheral edge of the p type element isolation region 7 at the outer side thereof in plan view.

That is, the extension portion (withstand voltage improving wiring) 25B is disposed such as to cover a portion of an element termination region 30 that is a peripheral edge region of the element region 2 and is between the outer peripheral edge of the n⁺ type drain contact region 14 and the inner peripheral edge of the p type element isolation region 7 at the outer side thereof.

The extension portion 25B suffices to extend further outward than the outer peripheral edge of the n⁺ type drain contact region 14 in plan view. Therefore, in plan view, the extension portion 25B may, for example, extend from the n⁺ type drain contact region 14 to an arbitrary position between the outer peripheral edge of the n⁺ type drain contact region 14 and the inner peripheral edge of the p type element isolation region 7 at the outer side thereof and may extend further outward than the inner peripheral edge of the p type element isolation region 7.

If a wiring (hereinafter referred to as "other wiring") of another element besides the DMOS transistor 40 passes above the element region 2, an equipotential distribution when a reverse voltage is applied to a parasitic diode present between the n⁻ type epitaxial layer 5 and the p type element isolation region 7 may be disturbed and a withstand voltage may decrease due to influence of a potential from the other wiring. Although, the equipotential distribution will not be disturbed if the potential of the other wiring is the same as a potential (drain voltage) of the element region 2, the equipotential distribution will be disturbed if the potential of the other wiring is a ground potential.

In this preferred embodiment, the extension portion (withstand voltage improving wiring) 25B that covers at least a portion of the element termination region 30 is formed in the drain wiring 25. An arrangement where a wiring (withstand voltage improving wiring) of the same potential as the element region 2 is disposed on the element termination region 30 is thereby obtained and therefore, even if the potential of the other wiring is the ground potential, influence of the potential of the other wiring can be suppressed. Thereby, when the potential of the other wiring is the ground potential, the disturbance of the equipotential distribution can be suppressed and decrease in the withstand voltage of the DMOS transistor 40 can be suppressed or the withstand voltage can be improved.

The semiconductor device 1 of FIG. 1 and FIG. 2 shall be referred to as "the present preferred embodiment" and an arrangement with which the drain wiring 25 in the semiconductor device 1 of FIG. 1 and FIG. 2 is not provided with the extension portion 25B shall be referred to as a "comparative example." That is, in the comparative example, the drain wiring 25 is constituted of just the main wiring portion 25A of the present preferred embodiment.

Figure 3:
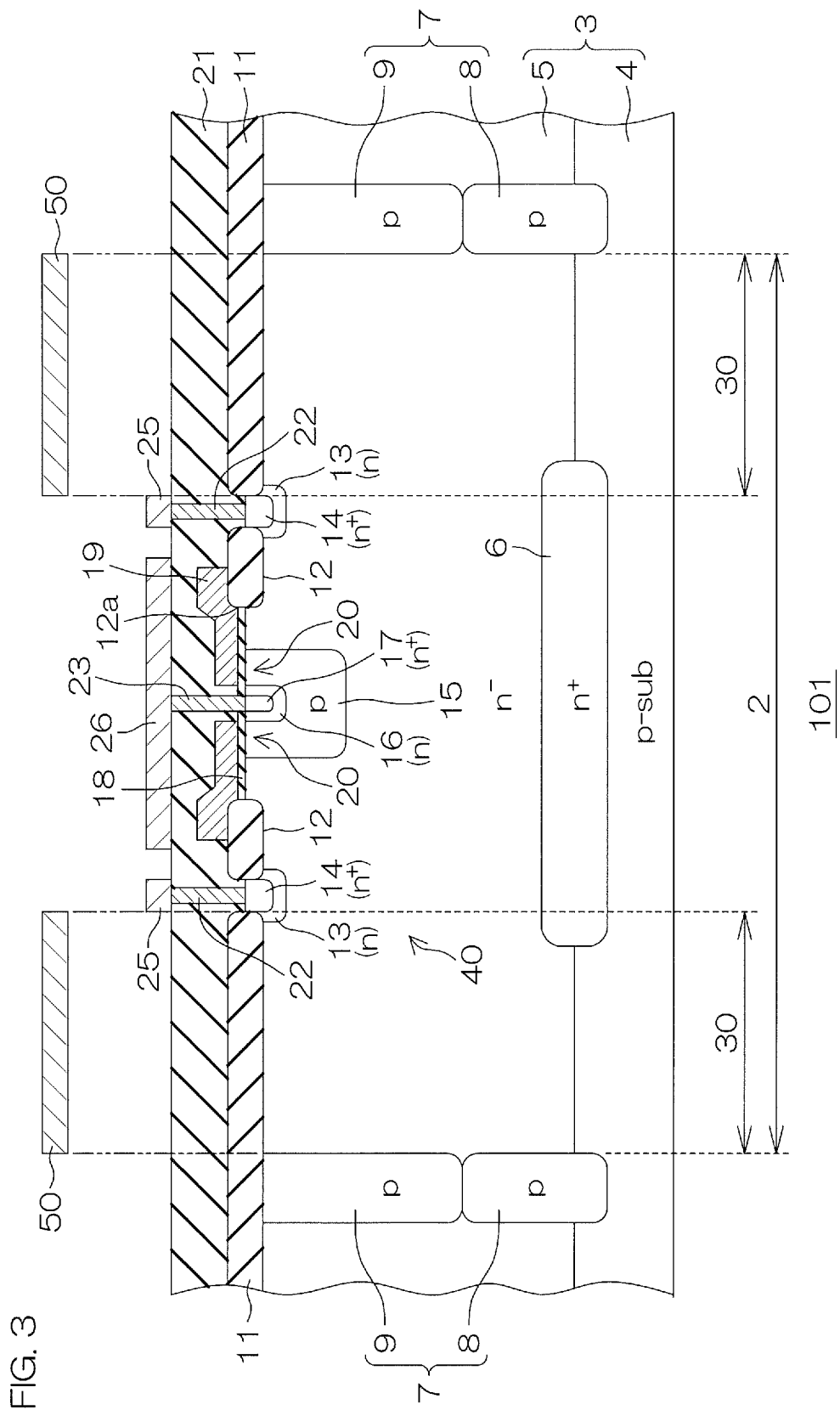
FIG. 3 is an illustrative sectional view of an example of a simulation model regarding a comparative example.

First, in regard to the comparative example, a first simulation model 101 in which another wiring 50 (hereinafter referred to as "GND wiring") with the potential being the ground potential is disposed on the element termination region 30 as shown in FIG. 3 was used to calculate a withstand voltage of the comparative example. In FIG. 3, respective portions corresponding to those in FIG. 2 described above are indicated with the same reference signs attached as in FIG. 2. Also, in regard to the comparative example, a second simulation model in which the GND wiring is not disposed on the element termination region 30 was used to calculate the withstand voltage of the comparative example.

Specifically, the reverse voltage that is applied to the parasitic diode present between the n⁻ type epitaxial layer 5 (n⁺ type drain contact region 14) and the p type element isolation region 7 shall be denoted as $V_{epi}$ [V]. Also, a reverse current that flows through the parasitic diode shall be denoted as $I_{epi}$ [A]. The reverse current $I_{epi}$ when the reverse voltage $V_{epi}$ is gradually increased was calculated by simulation.

Similarly, in regard to the present preferred embodiment, a third simulation model in which the GND wiring is disposed on the element termination region 30 was used to calculate the withstand voltage of the present preferred embodiment. Also, in regard to the present preferred embodiment, a fourth simulation model in which the GND wiring is not disposed was used to calculate the withstand voltage of the present preferred embodiment.

Figure 4:
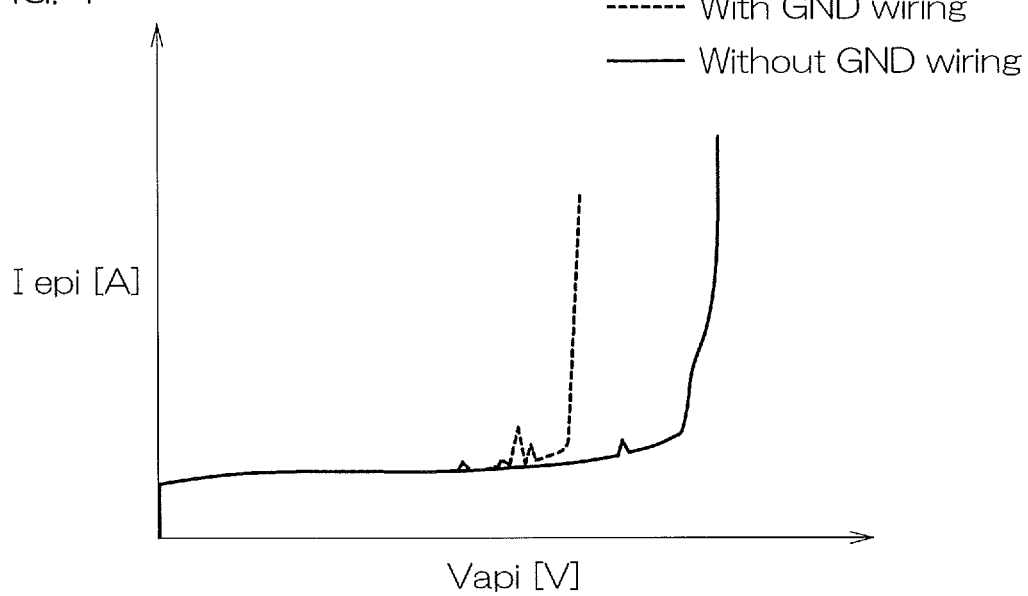
FIG. 4 is a graph of simulation results for the comparative example.

FIG. 4 is a graph of simulation results for the comparative example. In FIG. 4, the broken line is a graph of the simulation results when the GND wiring is present and the solid line is a graph of the simulation results when the GND wiring is not present.

Figure 5:
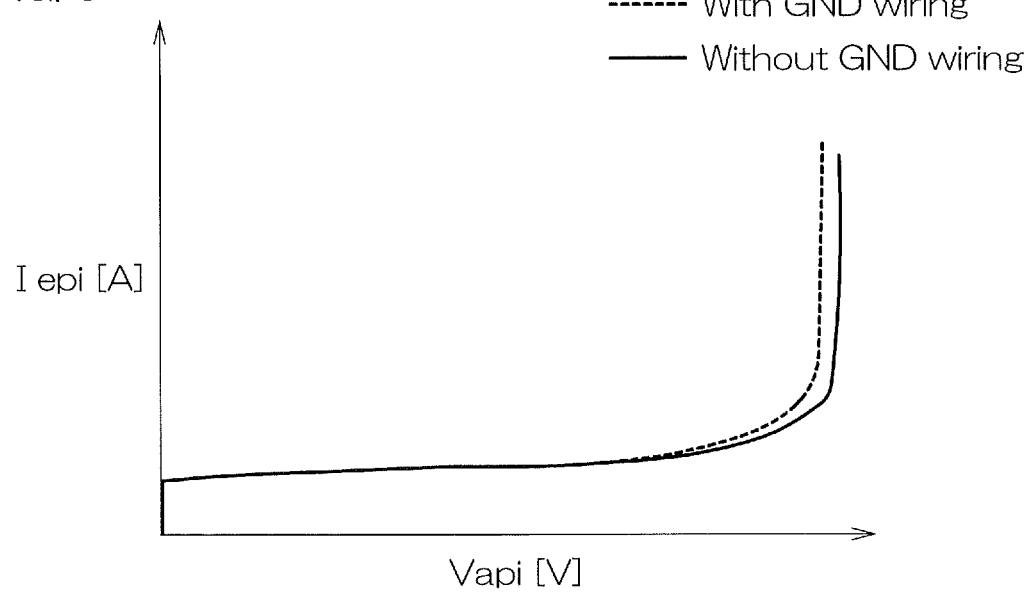
FIG. 5 is a graph of simulation results for the present preferred embodiment.

FIG. 5 is a graph of simulation results for the present preferred embodiment. In FIG. 5, the broken line is a graph of the simulation results when the GND wiring is present and the solid line is a graph of the simulation results when the GND wiring is not present.

Referring to FIG. 4, with the comparative example, a breakdown voltage when the GND wiring is present is lower than that when the GND wiring is not present. Also with the comparative example, an absolute value difference between the breakdown voltage when the GND wiring is present and the breakdown voltage when the GND wiring is not present is comparatively large.

On the other hand, referring to FIG. 5, with the present preferred embodiment, a breakdown voltage when the GND wiring is present and a breakdown voltage when the GND wiring is not present are substantially equal. Moreover, the breakdown voltage of the present preferred embodiment when the GND wiring is not present is higher than the breakdown voltage of the comparative example when the GND wiring is not present.

That is, with the present preferred embodiment, the withstand voltage when the other wiring of the ground potential is present is substantially equal to the withstand voltage when the other wiring of the ground potential is not present. In other words, with the present preferred embodiment, even when the other wiring of the ground potential is present, the withstand voltage of the DMOS transistor does not decrease much.

Also, with the present preferred embodiment, the withstand voltage when the other wiring of the ground potential is present is higher than that of the comparative example. Further, with the present preferred embodiment, the withstand voltage when the other wiring of the ground potential is not present is also higher than that of the comparative example.

Also, as a result of performing similar simulations upon changing an outward projection amount of the extension portion (withstand voltage improving wiring) 25B of the present preferred embodiment, it was found that in all cases, the absolute value difference between the breakdown voltage when the GND wiring is present and that when the GND wiring is not present decreased in comparison to the comparative example. Also, if a distance between the outer peripheral edge of the $n^+$ type drain contact region 14 and the inner peripheral edge of the p type element isolation region 7 at the outer side thereof in plan view is L, the withstand voltage was maximized when the outward projection amount of the extension portion (withstand voltage improving wiring) 25B was approximately half of L (approximately 0.5 L).

Next, a manufacturing process of the semiconductor device 1 shall be described with reference to FIG. 6A to FIG. 6G. FIG. 6A to FIG. 6G are sectional views for describing an example of the manufacturing process of the semiconductor device 1 and are sectional views corresponding to the section plane of FIG. 2.

Figure 6B:
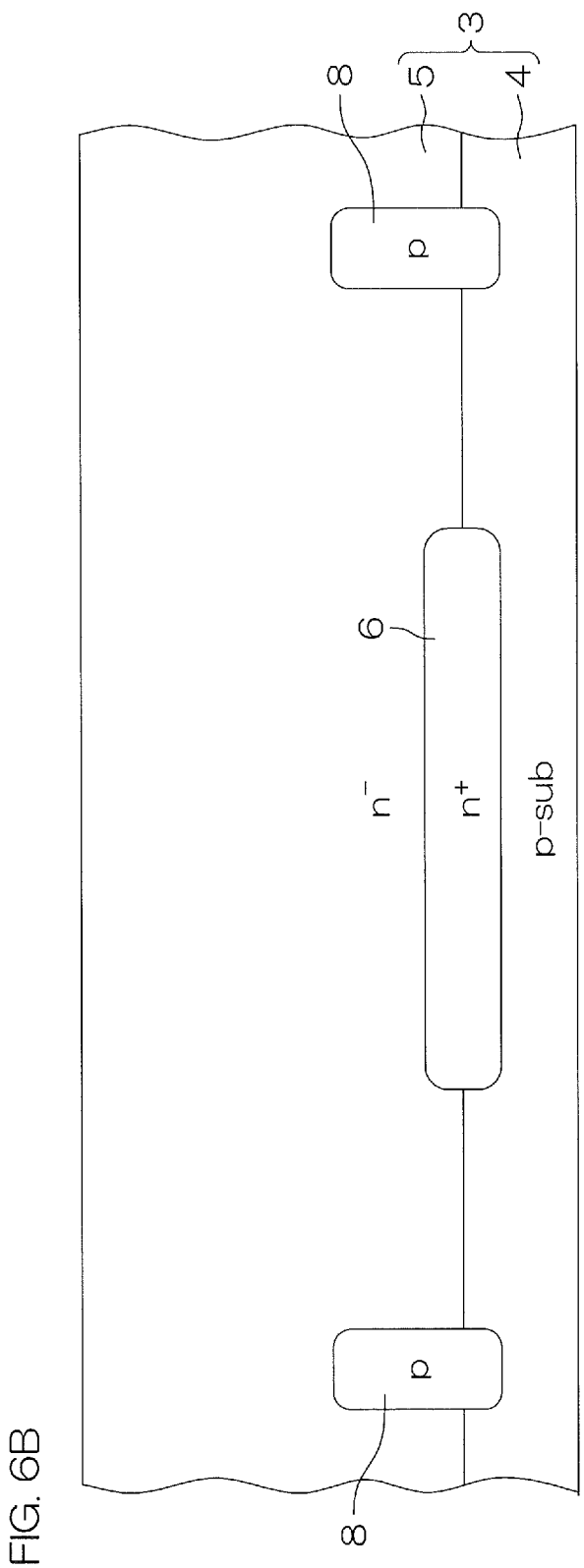
FIG. 6B is a sectional view of a step subsequent to that of FIG. 6A.

To manufacture the semiconductor device 1, the p type semiconductor substrate 4 is prepared as shown in FIG. 6A. Next, an n type impurity and a p type impurity are selectively implanted into a front surface of the p type semiconductor substrate 4. Silicon is then epitaxially grown on the p type semiconductor substrate 4 while adding the n type impurity under a heated state, for example, of not less than 1100° C. The base body 3 that includes the p type semiconductor substrate 4 and the $n^-$ type epitaxial layer 5 is thereby formed as shown in FIG. 6B.

In the process of epitaxial growth, the n type impurity and the p type impurity implanted in the p type semiconductor substrate 4 diffuse in a growth direction of the n– type epitaxial layer 5. The $n^+$ type embedded layer 6 and the lower isolation region 8 of the p type that extend across the boundary between the p type semiconductor substrate 4 and the n– type epitaxial layer 5 are thereby formed. Here, as the p type impurity, for example, B (boron), Al (aluminum), etc., can be cited and as the n type impurity, for example, P (phosphorus), As (arsenic), etc., can be cited.

Figure 6C:
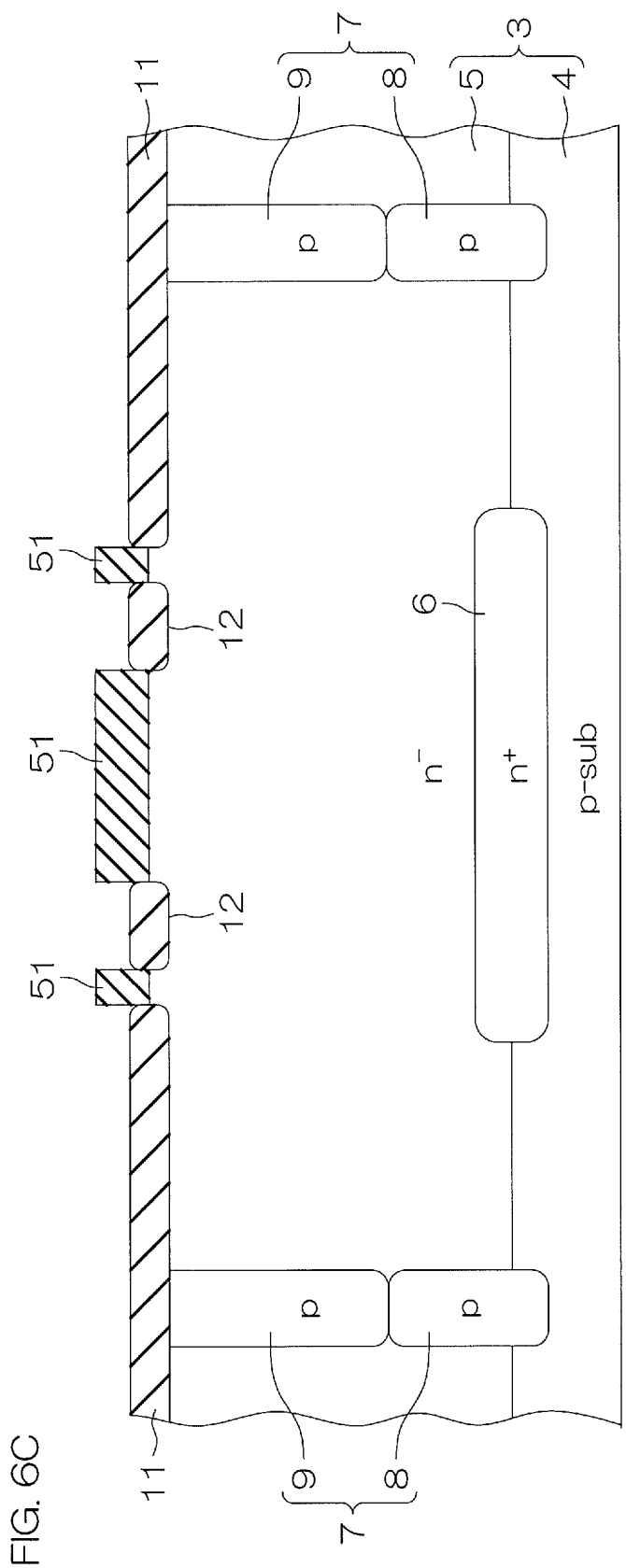
FIG. 6C is a sectional view of a step subsequent to that of FIG. 6B.

Next, an ion implantation mask (not shown) having an opening selectively in a region in which the upper isolation region 9 of the p type is to be formed as shown in FIG. 6C is formed on the n– type epitaxial layer 5. The p type impurity is then implanted into the n– type epitaxial layer 5 via the ion implantation mask. The p type element isolation region 7 that is constituted of a two-layer structure of the lower isolation region 8 and the upper isolation region 9 is thereby formed. The ion implantation mask is thereafter removed.

Next, a hard mask 51 having openings selectively in regions in which the field insulating films 11 and 12 are to be formed is formed on the n– type epitaxial layer 5. A thermal oxidation treatment is then applied to the front surface of the n– type epitaxial layer 5 via the hard mask 51 to form the field insulating films 11 and 12. The hard mask 51 is thereafter removed.

Figure 6D:
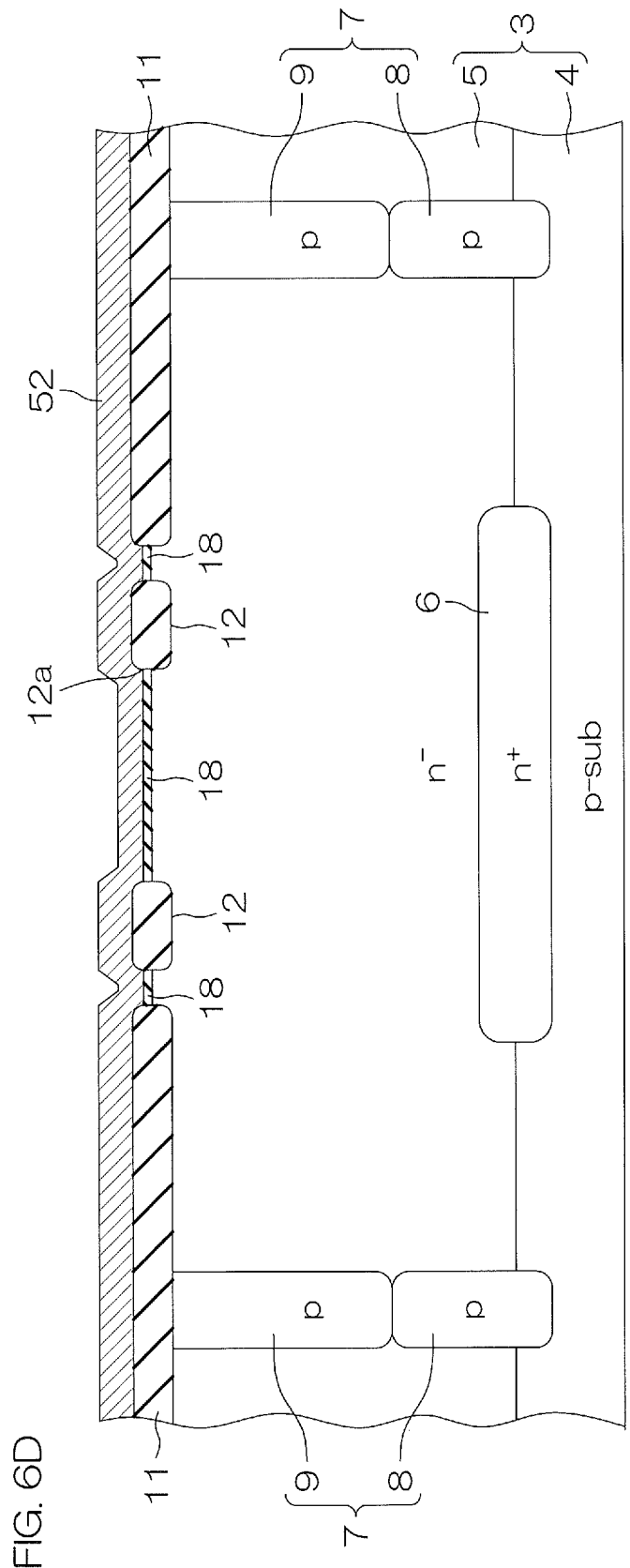
FIG. 6D is a sectional view of a step subsequent to that of FIG. 6C.

Next, as shown in FIG. 6D, a thermal oxidation treatment is applied to the front surface of the n– type epitaxial layer 5 to form the gate insulating film 18. In this process, the gate insulating film 18 is formed such as to be continuous with the field insulating films 11 and 12. Next, the polysilicon for the gate electrode 19 is deposited on the n– type epitaxial layer 5 to form a polysilicon layer 52.

Figure 6E:
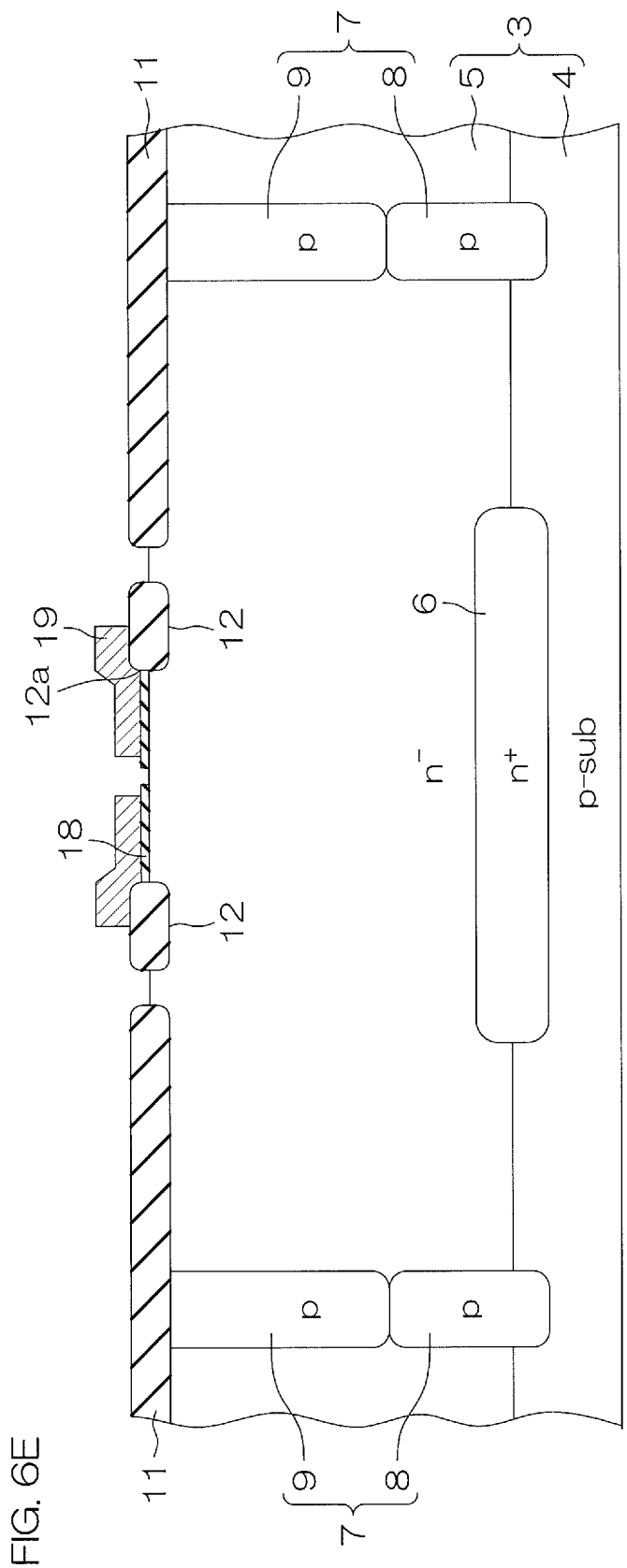
FIG. 6E is a sectional view of a step subsequent to that of FIG. 6D.

Next, a resist mask (not shown) having an opening selectively in a region in which the gate electrode 19 is to be formed as shown in FIG. 6E is formed on the polysilicon layer 52. Unnecessary portions of the polysilicon layer 52 are then removed by etching via the resist mask. The gate electrode 19 is thereby formed. The resist mask is thereafter removed.

Next, in order to remove unnecessary portions of the gate insulating film 18, a hard mask (not shown) having openings selectively is formed on the n– type epitaxial layer 5. An etching treatment is then applied to the unnecessary portions of the gate insulating film 18 via the hard mask. The predetermined gate insulating film 18 is thereby formed. The hard mask is thereafter removed. Here, this step of selectively etching the gate insulating film 18 may be omitted.

Figure 6F:
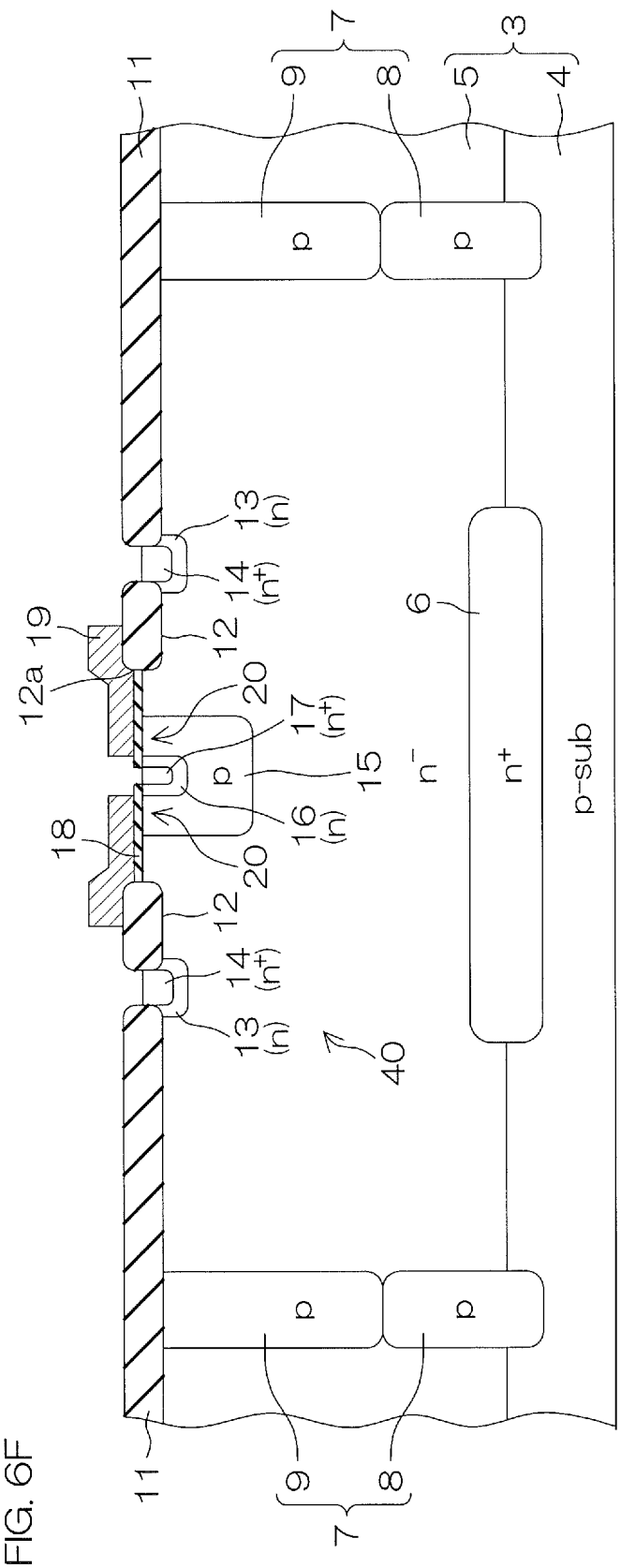
FIG. 6F is a sectional view of a step subsequent to that of FIG. 6E.

Next, as shown in FIG. 6F, the p type well region 15 is formed in the surface layer portion of the n– type epitaxial layer 5. To form the p type well region 15, first, an ion implantation mask (not shown) having an opening selectively in a region in which the p type well region 15 is to be formed is formed. The p type impurity is then implanted into the n– type epitaxial layer 5 via the ion implantation mask. Thereafter, the p type impurity is thermally diffused at a temperature, for example, of 900° C. to 1100° C. The p type well region 15 is thereby formed. The ion implantation mask is thereafter removed.

Here, the p type well region 15 may instead be formed by selectively implanting the p type impurity into the n– type epitaxial layer 5 at a stage before the gate insulating film 18 and the gate electrode 19 are formed (FIG. 6C).

Next, the n type drain region 13 is formed in the surface layer portion of the n– type epitaxial layer 5 and, at the same time, the n type source region 16 is formed in an inner region (surface layer portion) of the p type well region 15. To form the n type drain region 13 and the n type source region 16, first, an ion implantation mask (not shown) having openings selectively and respectively in a region in which the n type drain region 13 is to be formed and a region in which the n type source region 16 is to be formed is formed. The n type impurity is then implanted into the n– type epitaxial layer 5 via the ion implantation mask. The n type drain region 13 and the n type source region 16 are thereby formed. The ion implantation mask is thereafter removed.

Next, the $n^+$ type drain contact region 14 and the $n^+$ type source contact region 17 are selectively formed respectively in respective inner regions (surface layer portions) of the n type drain region 13 and the n type source region 16. To form the $n^+$ type drain contact region 14 and the $n^+$ type source contact region 17, first, an ion implantation mask (not shown) having openings selectively and respectively in regions in which the $n^+$ type drain contact region 14 and the $n^+$ type source contact region 17 are to be formed is formed. The n type impurity is then implanted into the n type drain region 13 and the n type source region 16 via the ion implantation mask. The $n^+$ type drain contact region 14 and the $n^+$ type source contact region 17 are thereby formed. The ion implantation mask is thereafter removed.

Figure 6G:
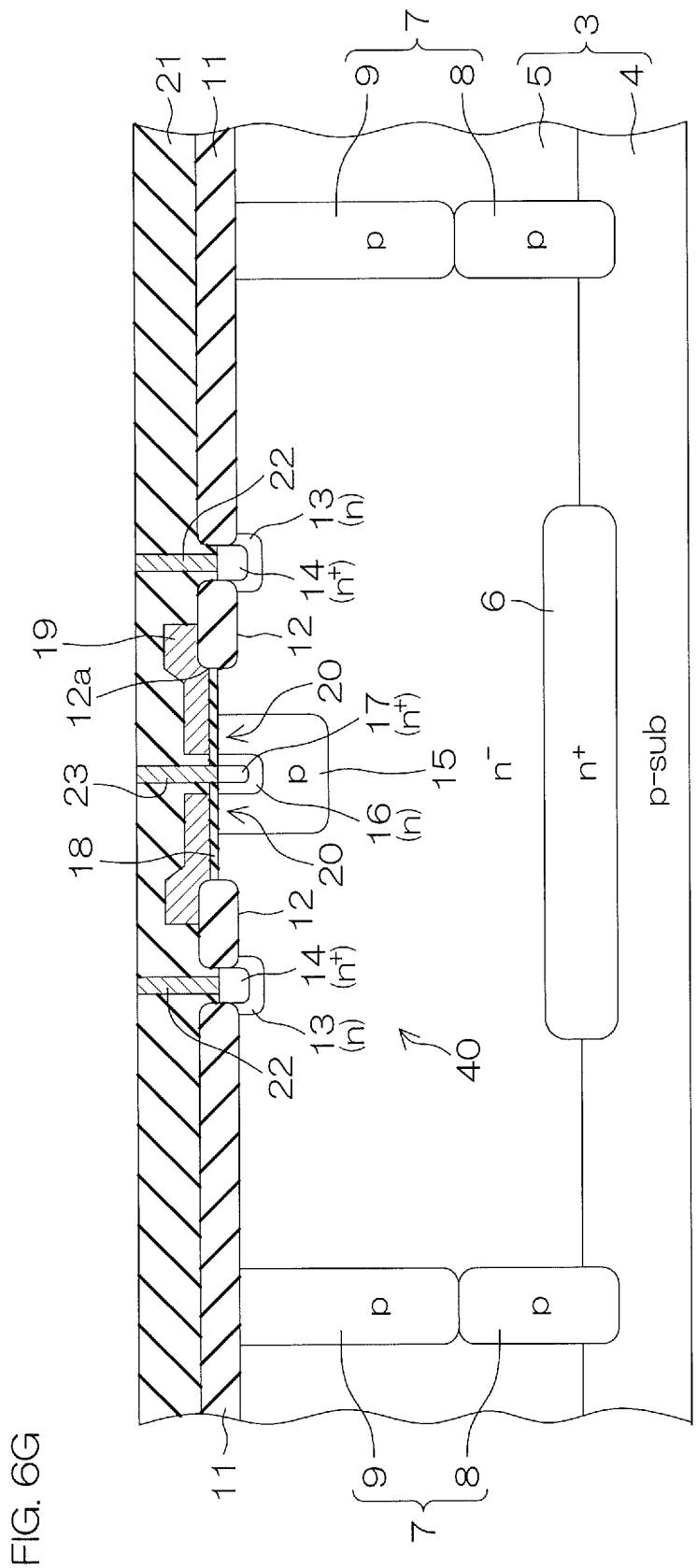
FIG. 6G is a sectional view of a step subsequent to that of FIG. 6F.

Next, as shown in FIG. 6G, an insulating material is deposited such as to cover the gate electrode 19 and the interlayer insulating film 21 is thereby formed. Next, the drain contact plugs 22, the source contact plugs 23, and the gate contact plugs 24 are formed such as to penetrate through the interlayer insulating film 21. The drain contact plugs 22, the source contact plugs 23, and the gate contact plugs 24 are electrically connected respectively to the $n^+$ type drain contact region 14, the $n^+$ type source contact region 17, and the gate electrode 19.

Lastly, the drain wiring 25, the source wiring 26, and the gate wiring (not shown) that are electrically connected respectively to the drain contact plugs 22, the source contact plugs 23, and the gate contact plugs 24 are selectively formed on the interlayer insulating film 21. To form the drain wiring 25, the source wiring 26, and the gate wiring, for example, a wiring material layer is formed on the interlayer insulating film 21. The drain wiring 25, the source wiring 26, and the gate wiring are then formed by selectively removing the wiring material layer by photolithography and etching. The semiconductor device 1 according to the first preferred embodiment is manufactured through the above steps.

Figure 7:
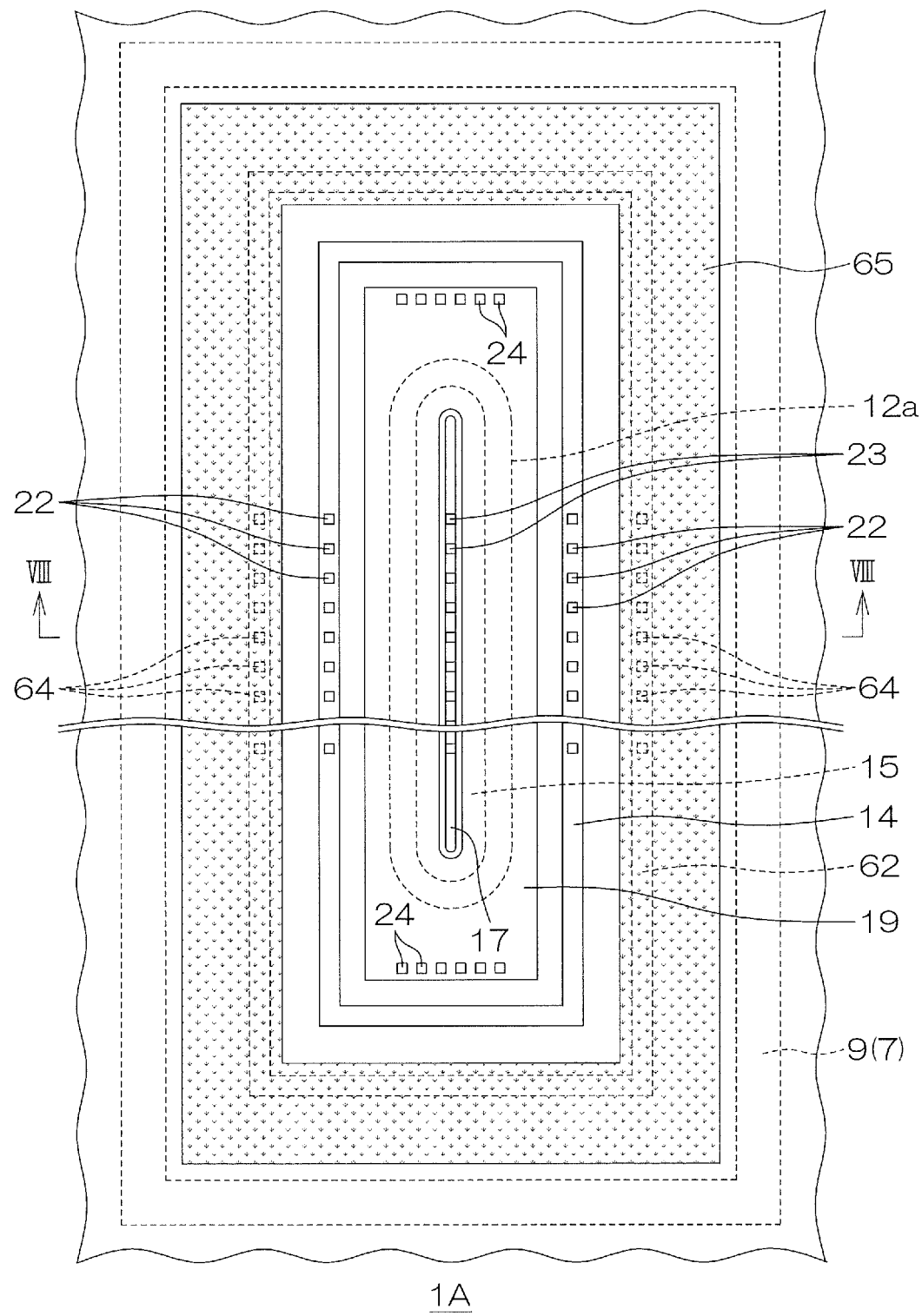
FIG. 7 is an illustrative plan view for describing the arrangement of a semiconductor device according to a second preferred embodiment of the present invention.
Figure 8:
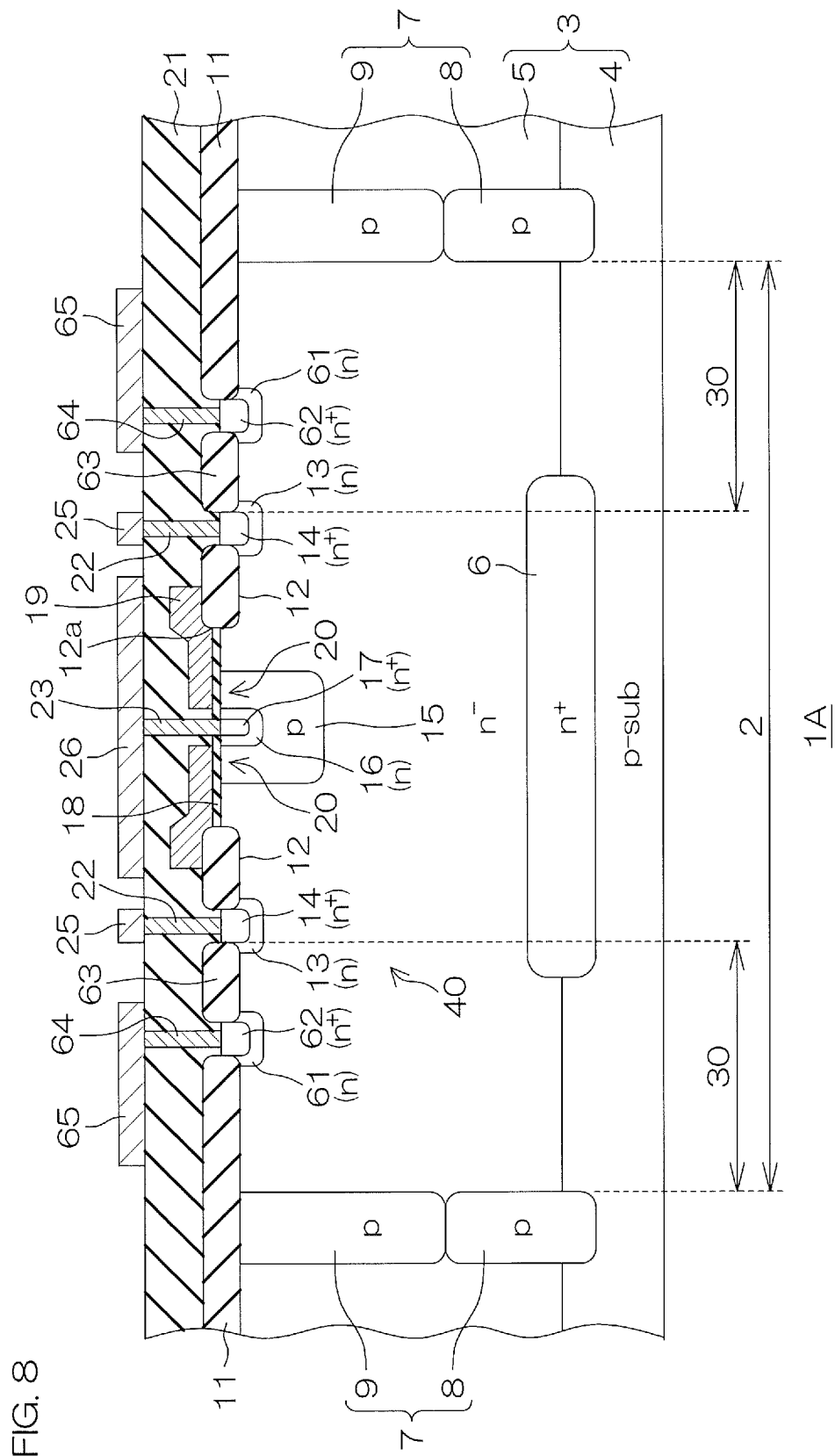
FIG. 8 is an illustrative sectional view taken along line VIII-VIII of FIG. 7.

Next, a semiconductor device 1A according to a second preferred embodiment of the present invention shall be described with reference to FIG. 7 and FIG. 8. FIG. 7 is an illustrative plan view for describing the arrangement of the semiconductor device according to the second preferred embodiment of the present invention. FIG. 8 is an illustrative sectional view taken along line VIII-VIII of FIG. 7. In FIG. 7, the interlayer insulating film 21, the drain wiring 25, and the source wiring 26 shown in FIG. 8 are omitted. However, a withstand voltage improving wiring 65 shown in FIG. 8 is illustrated in FIG. 7.

In FIG. 7, portions corresponding to respective portions in FIG. 1 described above are indicated with the same reference signs attached as in FIG. 1. In FIG. 8, portions corresponding to respective portions in FIG. 2 described above are indicated with the same reference signs attached as in FIG. 2.

In comparison to the semiconductor device 1 according to the first preferred embodiment described above, the semiconductor device 1A according to the second preferred embodiment differs in the arrangement of the withstand voltage improving wiring. In the semiconductor device 1 according to the first preferred embodiment, the withstand voltage improving wiring is arranged by the extension portion 25B of the drain wiring 25. In the semiconductor device 1A according to the second preferred embodiment, a withstand voltage improving wiring is provided separately and independently of the drain wiring 25.

In the second preferred embodiment, the inner peripheral edge of the field insulating film 11 that covers the front surface of the p type element isolation region 7 is positioned at a position separated by just a fixed distance outward from the outer peripheral edge of the $n^+$ type drain contact region 14 in plan view.

In a region between the n type drain region 13 and the field insulating film 11 in plan view, an n type region 61 is formed in the $n^-$ type epitaxial layer 5 at an interval from the n type drain region 13.

The n type region 61 is formed to a quadrilateral annular shape along the field insulating film 11 such as to surround the n type drain region 13 in plan view. An impurity concentration of the n type region 61 is substantially equal to the impurity concentration of the n type drain region 13. An $n^+$ type contact region 62 for withstand voltage improving wiring that has a higher impurity concentration than the n type region 61 is formed in a surface layer portion of the n type region 61. The impurity concentration of the $n^+$ type contact region 62 is substantially equal to the impurity concentration of the $n^+$ type drain contact region 14.

On the front surface of the $n^-$ type epitaxial layer 5, a field insulating film 63 of quadrilateral annular shape in plan view is formed in a portion between the $n^+$ type contact region 62 and the $n^+$ type drain contact region 14. The field insulating film 63 is a LOCOS film that is formed in the same step as the field insulating films 11 and 12 described above.

In addition to the drain contact plugs 22, the source contact plugs 23, and the gate contact plugs 24, contact plugs 64 for withstand voltage improving wiring are embedded in the interlayer insulating film 21. Lower ends of the contact plugs 64 are electrically connected to the $n^+$ type contact region 62.

In addition to the drain wiring 25, the source wiring 26, and the gate wiring (not shown), the withstand voltage improving wiring 65 is formed on the interlayer insulating film 21. In FIG. 7, a region of the withstand voltage improving wiring 65 is indicated as a dot-hatched region. In the second preferred embodiment, the drain wiring 25 is constituted of just the main wiring portion 25A of the drain wiring 25 of the first preferred embodiment. The withstand voltage improving wiring 65 is electrically connected to the $n^+$ type contact region 62 via the plurality of contact plugs 64.

The withstand voltage improving wiring 65 is formed to a quadrilateral annular shape such as to surround the field insulating film 63 in plan view. In this preferred embodiment, an inner peripheral edge of the withstand voltage improving wiring 65 is substantially directly above an inner peripheral edge of the $n^+$ type contact region 62. The inner peripheral edge of the withstand voltage improving wiring 65 may be at a position closer to the outer peripheral edge of the $n^+$ type drain contact region 14 in plan view. An outer peripheral edge of the withstand voltage improving wiring 65 is located further outward than an outer peripheral edge of the $n^+$ type contact region 62. In this preferred embodiment, the outer peripheral edge of the withstand voltage improving wiring 65 is at a position between the outer peripheral edge of the $n^+$ type contact region 62 and the inner peripheral edge of the p type element isolation region 7 at the outer side thereof in plan view.

That is, the withstand voltage improving wiring 65 is disposed such as to cover a portion (a width intermediate portion in this example) of the element termination region 30 that is the peripheral edge region of the element region 2 and is between the outer peripheral edge of the $n^+$ type drain contact region 14 and the inner peripheral edge of the p type element isolation region 7 at the outer side thereof.

In this preferred embodiment, the withstand voltage improving wiring 65 that covers at least a portion of the element termination region 30 is provided. An arrangement where the withstand voltage improving wiring 65 of the same potential as the element region 2 is disposed on the element termination region 30 is thereby obtained and therefore, even if the potential of another wiring is the ground potential, influence of the potential of the other wiring can be suppressed. The equipotential distribution when a reverse voltage is applied to the parasitic diode present between the $n^-$ type epitaxial layer and the p type element isolation region 7 can thereby be suppressed from being disturbed when the potential of the other wiring is the ground potential. Thereby, decrease in the withstand voltage of the DMOS transistor 40 can be suppressed or the withstand voltage can be improved.

Next, a manufacturing process of the semiconductor device 1A shall be described with reference to FIG. 9A to FIG. 9E. FIG. 9A to FIG. 9E are sectional views for describing an example of the manufacturing process of the semiconductor device 1A and are sectional views corresponding to the section plane of FIG. 8.

As in the method for manufacturing the semiconductor device 1 described above, even in the method for manufacturing the semiconductor device 1A, the p type semiconductor substrate 4 is similarly prepared as shown in FIG. 6A. The n type impurity and the p type impurity are then selectively implanted into the front surface of the p type semiconductor substrate 4 and thereafter, silicon is epitaxially grown on the p type semiconductor substrate 4 while adding the n type impurity under a heated environment, for example, of not less than 1100° C. The base body 3 that includes the p type semiconductor substrate 4 and the n− type epitaxial layer 5 is thereby formed as shown in FIG. 6B. Also thereby, the n+ type embedded layer 6 and the lower isolation region 8 of the p type that extend across the boundary between the p type semiconductor substrate 4 and the n− type epitaxial layer 5 are formed.

Next, an ion implantation mask (not shown) having an opening selectively in a region in which the upper isolation region 9 of the p type is to be formed as shown in FIG. 9A is formed on the n− type epitaxial layer 5. The p type impurity is then implanted into the n− type epitaxial layer 5 via the ion implantation mask. The p type element isolation region 7 that is constituted of the two-layer structure of the lower isolation region 8 and the upper isolation region 9 is thereby formed. The ion implantation mask is thereafter removed.

Next, a hard mask 71 having openings selectively in regions in which the field insulating films 11, 12, and 63 are to be formed is formed on the n− type epitaxial layer 5. A thermal oxidation treatment is then applied to the front surface of the n− type epitaxial layer 5 via the hard mask 71 to form the field insulating films 11, 12, and 63. The hard mask 71 is thereafter removed.

Figure 9B:
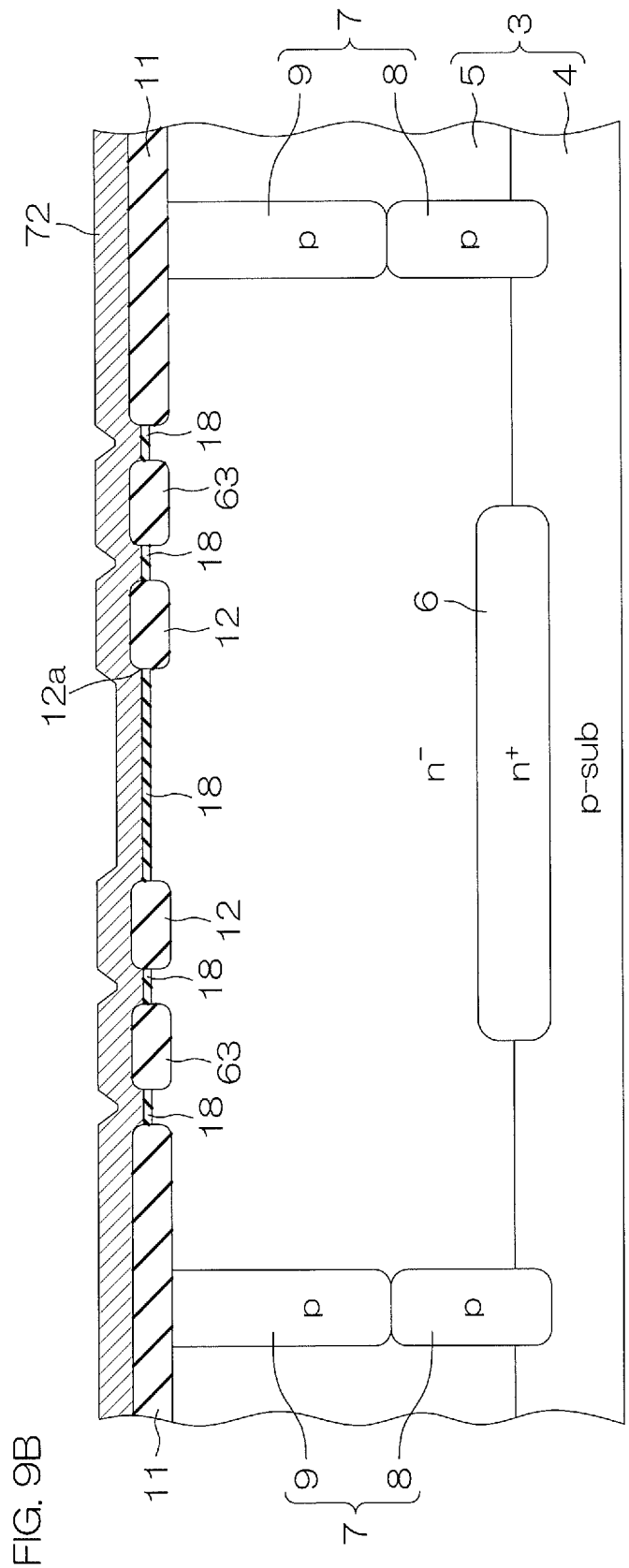
FIG. 9B is a sectional view of a step subsequent to that of FIG. 9A.

Next, as shown in FIG. 9B, a thermal oxidation treatment is applied to the front surface of the n− type epitaxial layer 5 to form the gate insulating film 18. In this process, the gate insulating film 18 is formed such as to be continuous with the field insulating films 11, 63, and 12. Next, the polysilicon for the gate electrode 19 is deposited on the n− type epitaxial layer 5 to form a polysilicon layer 72.

Figure 9C:
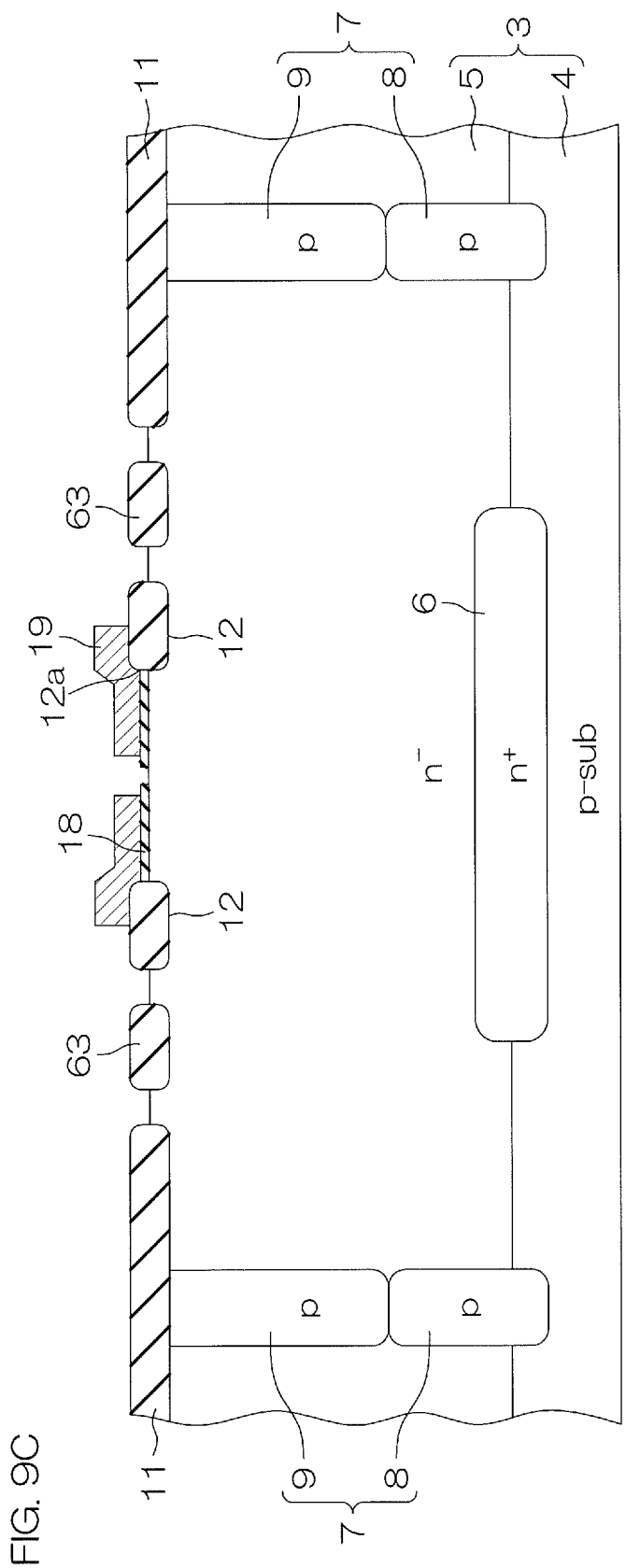
FIG. 9C is a sectional view of a step subsequent to that of FIG. 9B.

Next, a resist mask (not shown) having an opening selectively in a region in which the gate electrode 19 is to be formed as shown in FIG. 9C is formed on the polysilicon layer 72. Unnecessary portions of the polysilicon layer 72 are then removed by etching via the resist mask. The gate electrode 19 is thereby formed. The resist mask is thereafter removed.

Next, in order to remove unnecessary portions of the gate insulating film 18, a hard mask (not shown) having openings selectively is formed on the n− type epitaxial layer 5. An etching treatment is then applied to the unnecessary portions of the gate insulating film 18 via the hard mask. The predetermined gate insulating film 18 is thereby formed. The hard mask is thereafter removed. Here, this step of selectively etching the gate insulating film 18 may be omitted.

Figure 9D:
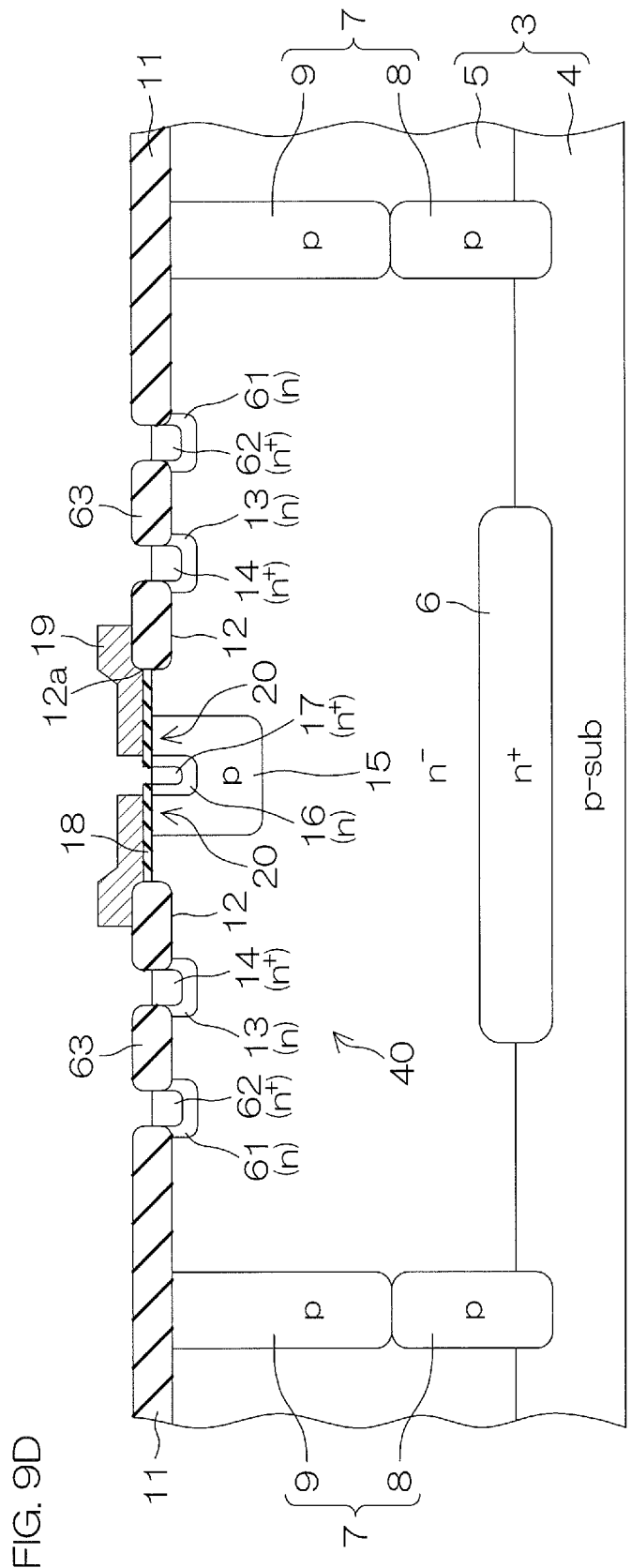
FIG. 9D is a sectional view of a step subsequent to that of FIG. 9C.

Next, as shown in FIG. 9D, the p type well region 15 is formed in the surface layer portion of the n− type epitaxial layer 5. To form the p type well region 15, first, an ion implantation mask (not shown) having an opening selectively in a region in which the p type well region 15 is to be formed is formed. The p type impurity is then implanted into the n− type epitaxial layer 5 via the ion implantation mask. Thereafter, the p type impurity is thermally diffused at a temperature, for example, of 900° C. to 1100° C. The p type well region 15 is thereby formed. The ion implantation mask is thereafter removed.

Here, the p type well region 15 may instead be formed by selectively implanting the p type impurity into the n− type epitaxial layer 5 at a stage before the gate insulating film 18 and the gate electrode 19 are formed (FIG. 9A).

Next, the n type drain region 13 and the n type region 61 are formed in the surface layer portion of the n− type epitaxial layer 5 and, at the same time, the n type source region 16 is formed in the inner region (surface layer portion) of the p type well region 15. The n type drain region 13, the n type region 61, and the n type source region 16 are formed, for example, as follows.

That is, first, an ion implantation mask (not shown) having openings selectively and respectively in a region in which the n type drain region 13 is to be formed, a region in which the n type region 61 is to be formed, and a region in which the n type source region 16 is to be formed is formed. The n type impurity is then implanted into the n− type epitaxial layer 5 via the ion implantation mask. The n type drain region 13, the n type region 61, and the n type source region 16 are thereby formed. The ion implantation mask is thereafter removed.

Next, the $n^+$ type drain contact region 14, the $n^+$ type contact region 62, and the $n^+$ type source contact region 17 are selectively formed respectively in respective inner regions (surface layer portions) of the n type drain region 13, the n type region 61, and the n type source region 16. The $n^+$ type drain contact region 14, the $n^+$ type contact region 62, and the $n^+$ type source contact region 17 are formed, for example, as follows.

That is, first, an ion implantation mask (not shown) having openings selectively and respectively in regions in which the $n^+$ type drain contact region 14, the $n^+$ type contact region 62, and the $n^+$ type source contact region 17 are to be formed is formed. The n type impurity is then implanted into the n type drain region 13, the n type region 61, and the n type source region 16 via the ion implantation mask. The $n^+$ type drain contact region 14, the $n^+$ type contact region 62, and the $n^+$ type source contact region 17 are thereby formed. The ion implantation mask is thereafter removed.

Figure 9E:
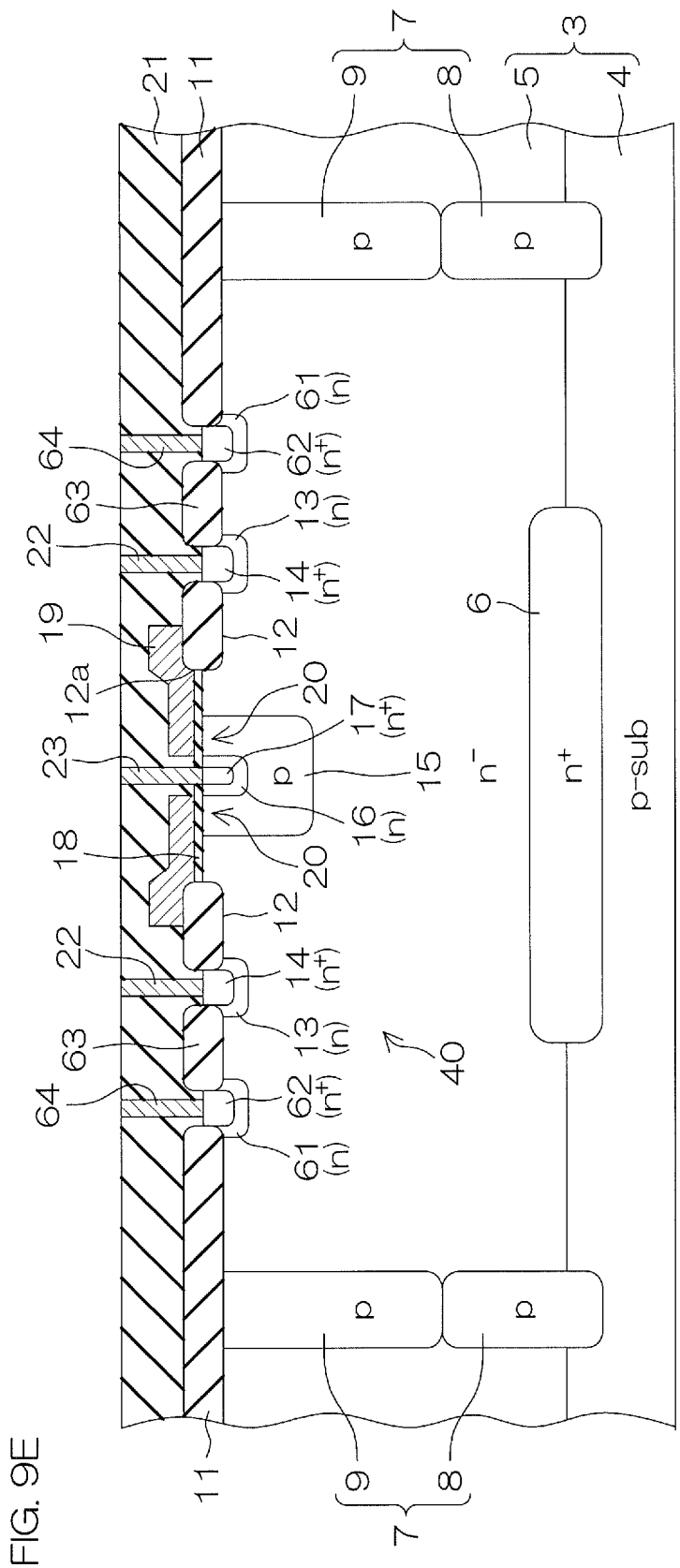
FIG. 9E is a sectional view of a step subsequent to that of FIG. 9D.

Next, as shown in FIG. 9E, an insulating material is deposited such as to cover the gate electrode 19 and the interlayer insulating film 21 is thereby formed. Next, the contact plugs 64, the drain contact plugs 22, the source contact plugs 23, and the gate contact plugs 24 are formed such as to penetrate through the interlayer insulating film 21. The contact plugs 64, the drain contact plugs 22, the source contact plugs 23, and the gate contact plugs 24 are electrically connected respectively to the $n^+$ type contact region 62, the $n^+$ type drain contact region 14, the $n^+$ type source contact region 17, and the gate electrode 19.

Lastly, the withstand voltage improving wiring 65, the drain wiring 25, the source wiring 26, and the gate wiring (not shown) that are electrically connected respectively to the contact plugs 64, the drain contact plugs 22, the source contact plugs 23, and the gate contact plugs 24 are selectively formed on the interlayer insulating film 21. To form the withstand voltage improving wiring 65, the drain wiring 25, the source wiring 26, and the gate wiring, for example, a wiring material layer is formed on the interlayer insulating film 21. The withstand voltage improving wiring 65, the drain wiring 25, the source wiring 26, and the gate wiring are then formed by selectively removing the wiring material layer by photolithography and etching. The semiconductor device 1A according to the second preferred embodiment is manufactured through the above steps.

Figure 10:
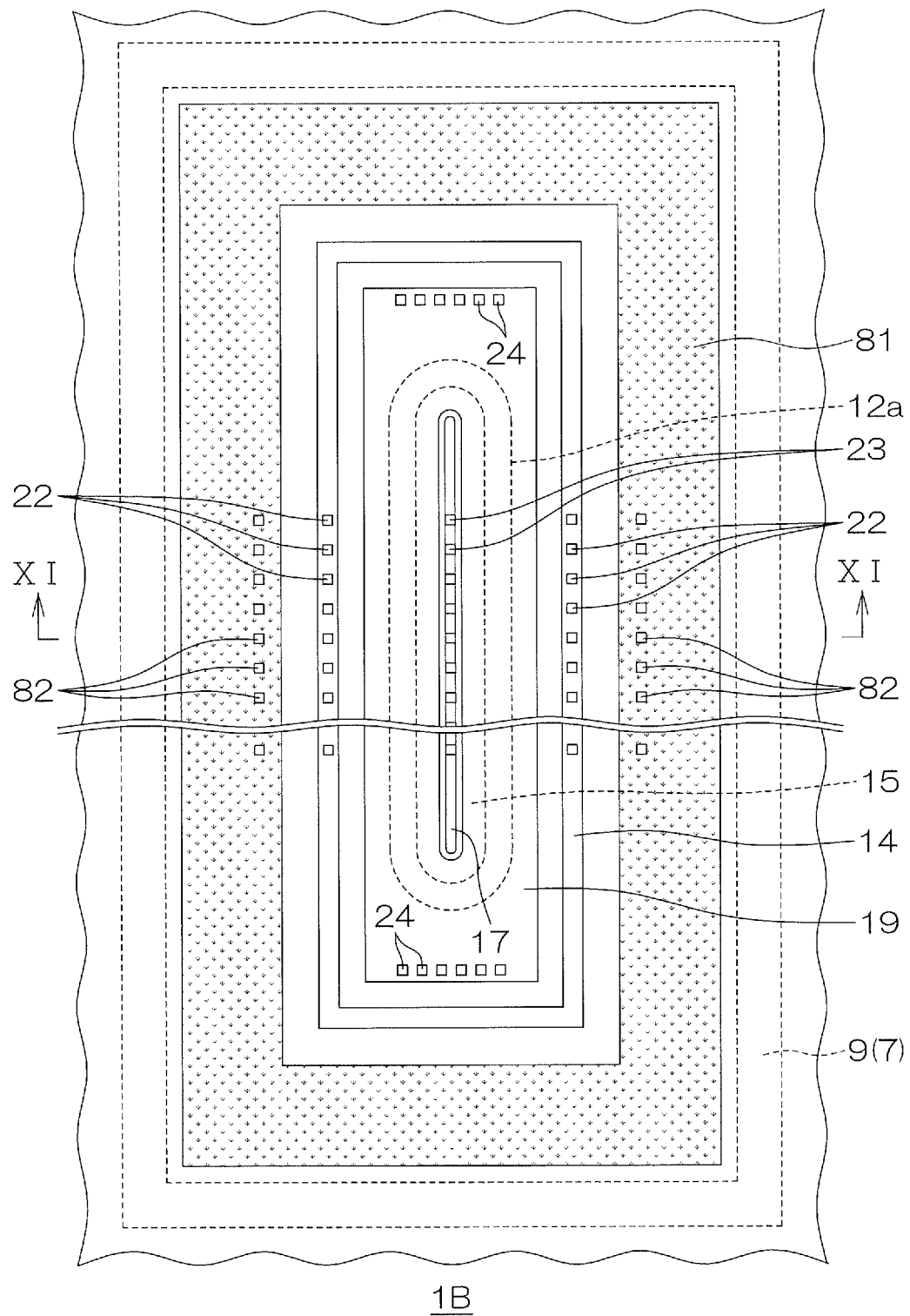
FIG. 10 is an illustrative plan view for describing the arrangement of a semiconductor device according to a third preferred embodiment of the present invention.
Figure 11:
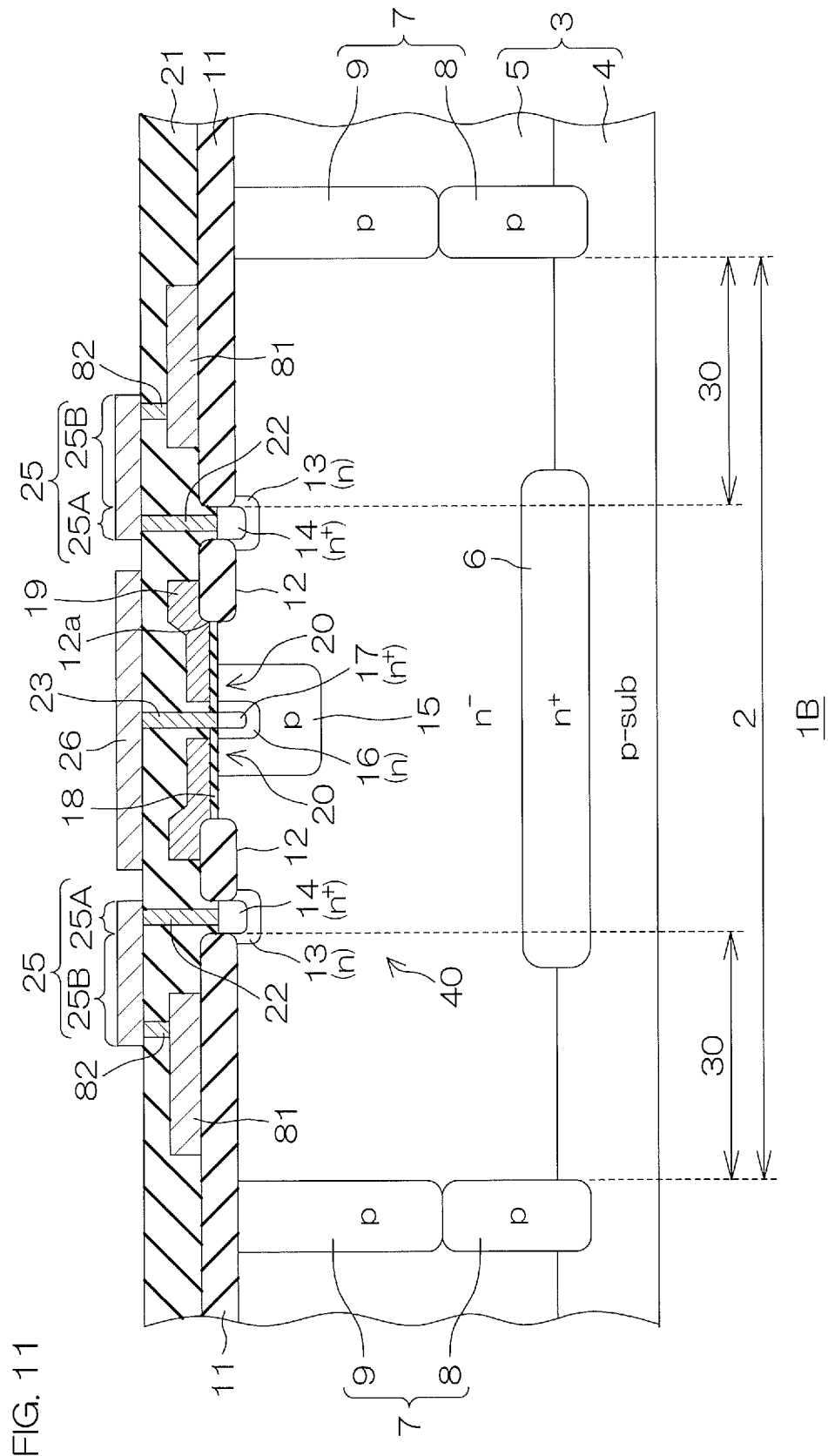
FIG. 11 is an illustrative sectional view taken along line XI-XI of FIG. 10.

Next, a semiconductor device 1B according to a third preferred embodiment of the present invention shall be described with reference to FIG. 10 and FIG. 11. FIG. 10 is an illustrative plan view for describing the arrangement of the semiconductor device according to the third preferred embodiment of the present invention. FIG. 11 is an illustrative sectional view taken along line XI-XI of FIG. 10. In FIG. 10, the interlayer insulating film 21, the drain wiring 25, and the source wiring 26 shown in FIG. 11 are omitted. However, a withstand voltage improving wiring 81 shown in FIG. 11 is illustrated in FIG. 10.

In FIG. 10, portions corresponding to respective portions in FIG. 1 described above are indicated with the same reference signs attached as in FIG. 1. In FIG. 11, portions corresponding to respective portions in FIG. 2 described above are indicated with the same reference signs attached as in FIG. 2.

In comparison to the semiconductor device 1 according to the first preferred embodiment described above, the semiconductor device 1B according to the third preferred embodiment differs in the arrangement of the withstand voltage improving wiring. In the semiconductor device 1 according to the first preferred embodiment, the withstand voltage improving wiring is arranged by the extension portion 25B of the drain wiring 25. In the semiconductor device 1B according to the third preferred embodiment, a withstand voltage improving wiring is provided separately and independently of the drain wiring 25. However, in this third preferred embodiment, the drain wiring 25 has the extension portion 25B as in the first preferred embodiment and this extension portion 25B also functions as a withstand voltage improving wiring.

In the third preferred embodiment, the withstand voltage improving wiring 81 is formed on the field insulating film 11. In FIG. 10, a region of the withstand voltage improving wiring 81 is indicated as a dot-hatched region. The withstand voltage improving wiring 81 is formed to a quadrilateral annular shape along the p type element isolation region 7 such as to surround the n$^+$ type drain contact region 14 in plan view. In this preferred embodiment, the withstand voltage improving wiring 81 is constituted of polysilicon. The withstand voltage improving wiring 81 is covered by the interlayer insulating film 21.

The withstand voltage improving wiring 81 is formed further outward than the n$^+$ type drain contact region 14 in plan view. In this preferred embodiment, an inner peripheral edge of the withstand voltage improving wiring 81 is positioned at a position separated by just a fixed distance outward from the n$^+$ type drain contact region 14 in plan view. Here, the inner peripheral edge of the withstand voltage improving wiring 81 may be directly above the outer peripheral edge of the n$^+$ type drain contact region 14. On the other hand, an outer peripheral edge of the withstand voltage improving wiring 81 is located further inside than the inner peripheral edge of the p type element isolation region 7.

That is, the withstand voltage improving wiring 81 is disposed such as to cover a portion (a width intermediate portion in this example) of the element termination region 30 that is the peripheral edge region of the element region 2 and is between the outer peripheral edge of the n$^+$ type drain contact region 14 and the inner peripheral edge of the p type element isolation region 7 at the outer side thereof.

The drain wiring 25 is constituted of the main wiring portion 25A that is disposed directly above the n$^+$ type drain contact region 14 and the extension portion 25B that extends outward from the outer peripheral edge of the main wiring portion 25A. The extension portion 25B has an overlapping portion that overlaps with the withstand voltage improving wiring 81 front surface in plan view. A plurality of contact plugs 82 for electrically connecting the overlapping portion of the extension portion 25B and the withstand voltage improving wiring 81 are embedded in the interlayer insulating film 21.

The withstand voltage improving wiring 81 is electrically connected to the drain wiring 25 via the plurality of contact plugs 82. The withstand voltage improving wiring 81 is thus electrically connected to the n$^-$ type epitaxial layer 5 via the contact plugs 82, the drain wiring 25, and the drain contact plugs 22.

In this preferred embodiment, the withstand voltage improving wiring 81 that covers at least a portion of the element termination region 30 is provided. An arrangement where the withstand voltage improving wiring 81 of the same potential as the element region 2 is disposed on the element termination region 30 is thereby obtained and therefore, even if the potential of another wiring is the ground potential, influence of the potential of the other wiring can be suppressed. The equipotential distribution when a reverse voltage is applied to the parasitic diode present between the n$^-$ type epitaxial layer and the p type element isolation region 7 can thereby be suppressed from being disturbed when the potential of the other wiring is the ground potential. Thereby, decrease in the withstand voltage of the DMOS transistor 40 can be suppressed or the withstand voltage can be improved.

Figure 12A:
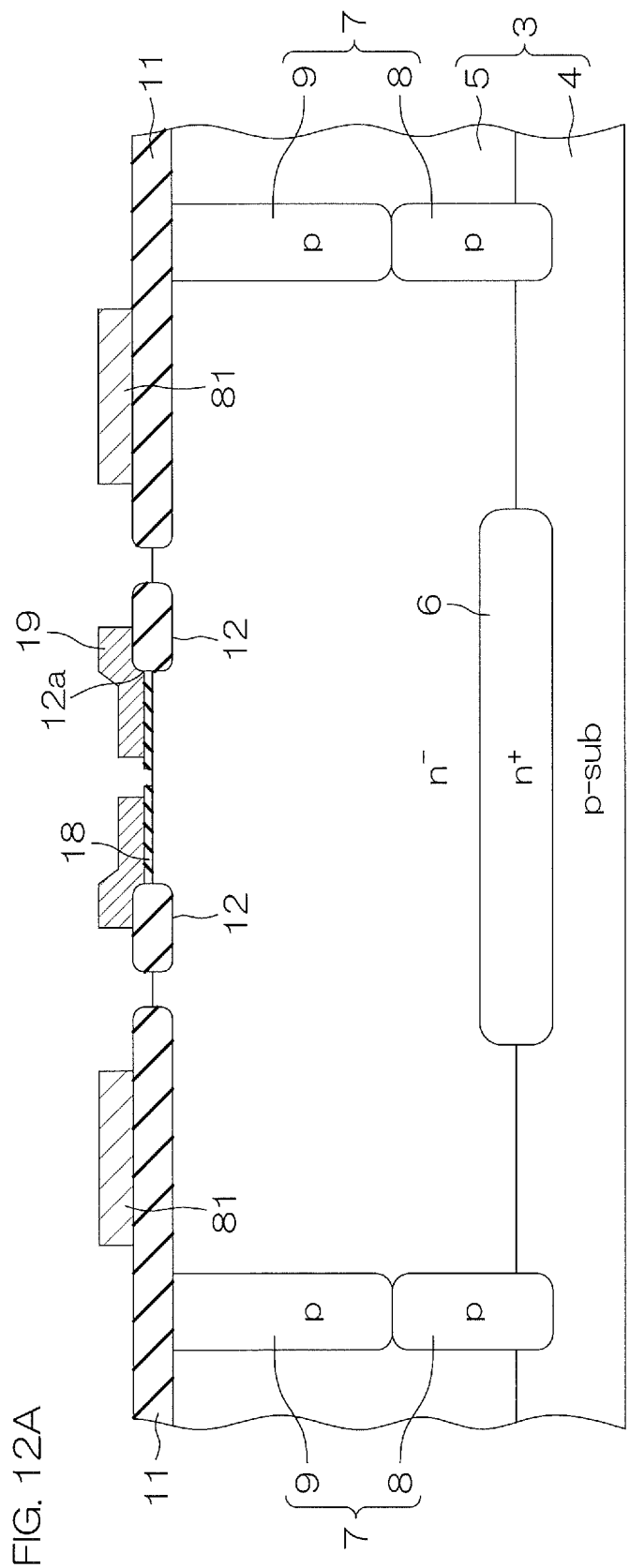
FIG. 12A is a sectional view of an example of a manufacturing process of the semiconductor device shown in FIG. 10 and FIG. 11 and is a sectional view corresponding to the section plane of FIG. 11.
Figure 12B:
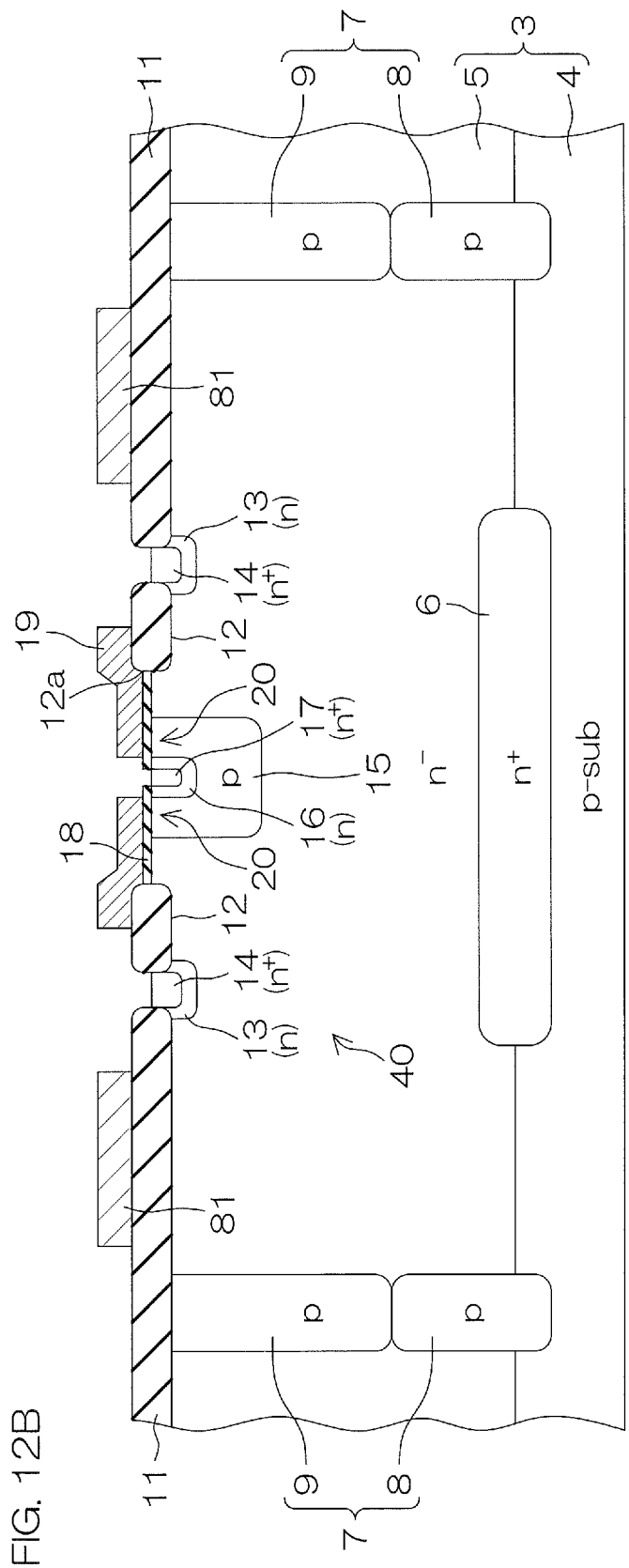
FIG. 12B is a sectional view of a step subsequent to that of FIG. 12A.
Figure 12C:
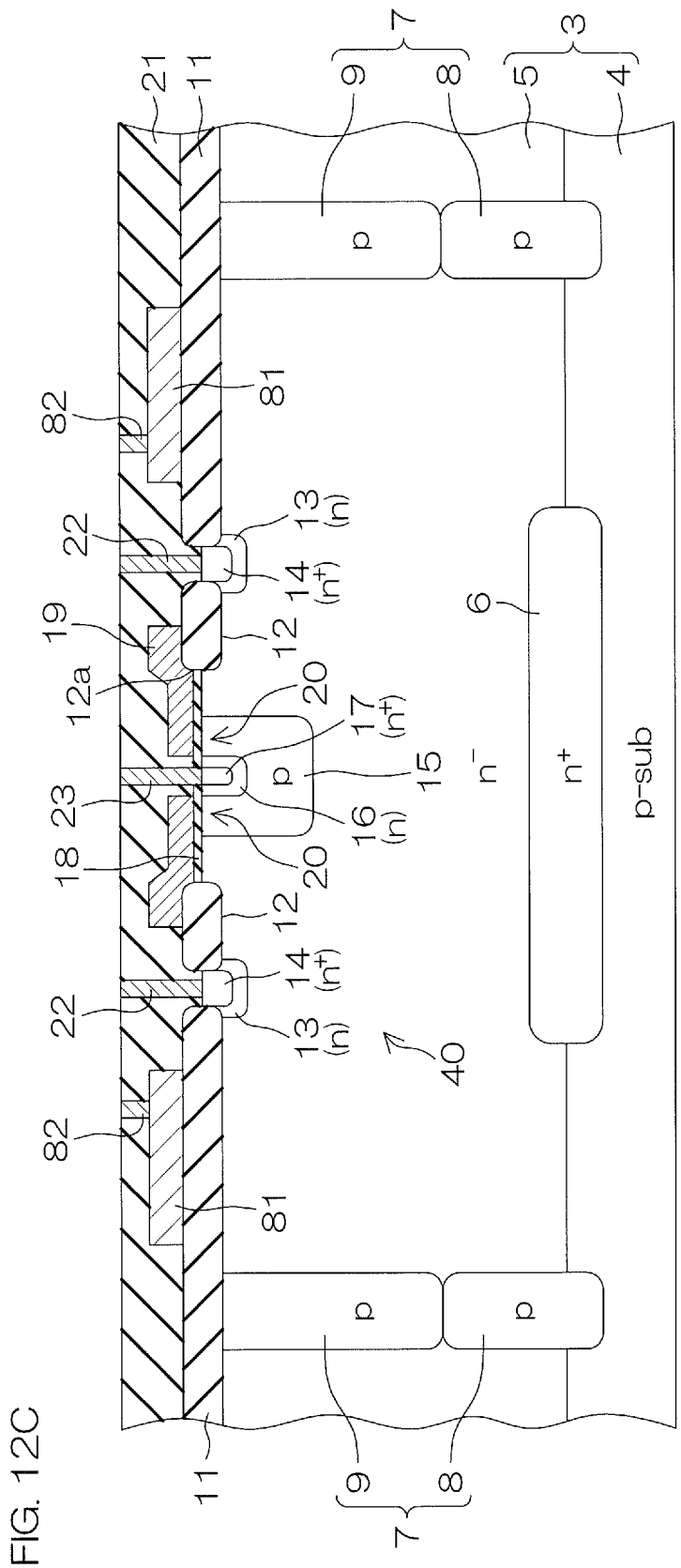
FIG. 12C is a sectional view of a step subsequent to that of FIG. 12B.

Next, a manufacturing process of the semiconductor device 1B shall be described with reference to FIG. 12A to FIG. 12C. FIG. 12A to FIG. 12C are sectional views for describing an example of the manufacturing process of the semiconductor device 1B and are sectional views corresponding to the section plane of FIG. 11.

The steps of FIG. 6A to FIG. 6D described above are applied as they are even in the method for manufacturing the semiconductor device 1B. When, by the step of FIG. 6D, polysilicon is deposited on the n− type epitaxial layer 5 and the polysilicon layer 52 is formed, a resist mask (not shown) having openings selectively and respectively in a region in which the gate electrode 19 is to be formed and a region in which the withstand voltage improving wiring 81 is to be formed as shown in FIG. 12A is formed on the polysilicon layer 52. Unnecessary portions of the polysilicon layer 52 are then removed by etching via the resist mask. The gate electrode 19 and the withstand voltage improving wiring 81 are thereby formed at the same time. The resist mask is thereafter removed.

Next, in order to remove unnecessary portions of the gate insulating film 18, a hard mask (not shown) having openings selectively is formed on the n− type epitaxial layer 5. An etching treatment is then applied to the unnecessary portions of the gate insulating film 18 via the hard mask. The predetermined gate insulating film 18 is thereby formed. The hard mask is thereafter removed. Here, this step of selectively etching the gate insulating film 18 may be omitted.

Next, as shown in FIG. 12B, the p type well region 15 is formed in the surface layer portion of the n− type epitaxial layer 5. To form the p type well region 15, first, an ion implantation mask (not shown) having an opening selectively in a region in which the p type well region 15 is to be formed is formed. The p type impurity is then implanted into the n− type epitaxial layer 5 via the ion implantation mask. Thereafter, the p type impurity is thermally diffused at a temperature, for example, of 900° C. to 1100° C. The p type well region 15 is thereby formed. The ion implantation mask is thereafter removed.

Here, the p type well region 15 may instead be formed by selectively implanting the p type impurity into the n− type epitaxial layer 5 at a stage before the gate insulating film 18 and the gate electrode 19 are formed (FIG. 6C).

Next, the n type drain region 13 is formed in the surface layer portion of the n− type epitaxial layer 5 and, at the same time, the n type source region 16 is formed in the inner region (surface layer portion) of the p type well region 15. To form the n type drain region 13 and the n type source region 16, first, an ion implantation mask (not shown) having openings selectively and respectively in a region in which the n type drain region 13 is to be formed and a region in which the n type source region 16 is to be formed is formed. The n type impurity is then implanted into the n− type epitaxial layer 5 via the ion implantation mask. The n type drain region 13 and the n type source region 16 are thereby formed. The ion implantation mask is thereafter removed.

Next, the $n^+$ type drain contact region 14 and the $n^+$ type source contact region 17 are selectively formed respectively in respective inner regions (surface layer portions) of the n type drain region 13 and the n type source region 16. To form the $n^+$ type drain contact region 14 and the $n^+$ type source contact region 17, first, an ion implantation mask (not shown) having openings selectively and respectively in regions in which the $n^+$ type drain contact region 14 and the $n^+$ type source contact region 17 are to be formed is formed. The n type impurity is then implanted into the n type drain region 13 and the n type source region 16 via the ion implantation mask. The $n^+$ type drain contact region 14 and the $n^+$ type source contact region 17 are thereby formed. The ion implantation mask is thereafter removed.

Next, as shown in FIG. 12C, an insulating material is deposited such as to cover the gate electrode 19 and the withstand voltage improving wiring 81 and the interlayer insulating film 21 is thereby formed. Next, the drain contact plugs 22, the source contact plugs 23, the gate contact plugs 24, and the contact plugs 82 are formed such as to penetrate through the interlayer insulating film 21. The drain contact plugs 22, the source contact plugs 23, the gate contact plugs 24, and the contact plugs 82 are electrically connected respectively to the $n^+$ type drain contact region 14, the $n^+$ type source contact region 17, the gate electrode 19, and the withstand voltage improving wiring 81.

Lastly, the drain wiring 25, the source wiring 26, and the gate wiring (not shown) are selectively formed on the interlayer insulating film 21. The drain wiring 25 is electrically connected to the drain contact plugs 22 and the withstand voltage improving wiring contact plugs 82. The source wiring 26 and the gate wiring are electrically connected respectively to the source contact plugs 23 and the gate contact plugs 24. The semiconductor device 1B according to the third preferred embodiment is manufactured through the above steps.

While preferred embodiments of the present invention were described in detail above, these are merely specific examples used to clarify the technical contents of the present invention and the present invention should not be interpreted as being limited to these specific examples and the scope of the present invention is limited only by the appended claims.

The present application corresponds to Japanese Patent Application No. 2020-44368 filed on Mar. 13, 2020 in the Japan Patent Office, and the entire disclosure of this application is incorporated herein by reference.

REFERENCE SIGNS LIST 1, 1A, 1B semiconductor device
2 element region
3 base body
4 p type semiconductor substrate
5 $n^-$ type epitaxial layer
6 $n^+$ type embedded layer
7 p type element isolation region
8 lower isolation region
9 upper isolation region
11 field insulating film
12 field insulating film
13 n type drain region
14 $n^+$ type drain contact region
15 p type well region
16 n type source region
17 $n^+$ type source contact region
18 gate insulating film
19 gate electrode
20 channel region
21 interlayer insulating film
22 drain contact plug
23 source contact plug
24 gate contact plug
25 drain wiring
25A main wiring portion
25B extension portion (withstand voltage improving wiring)
26 source wiring
30 element termination region
40 DMOS transistor
51, 71 hard mask
52, 72 polysilicon layer
61 n type region
62 $n^+$ type contact region
63 field insulating film
64, 82 contact plug
65, 81 withstand voltage improving wiring

The invention claimed is:

1. A semiconductor device comprising:
a base body that includes a p type substrate and an n type semiconductor layer formed on the p type substrate and includes an element region having a transistor with the n type semiconductor layer as a drain;
a p type element isolation region that is formed in a surface layer portion of the base body so as to demarcate the element region; and
a conductive wiring that is disposed on a peripheral edge portion of the element region and is electrically connected to the n type semiconductor layer;
wherein
the transistor includes an n type drain contact region that is formed in a surface layer portion of the n type semiconductor layer in the peripheral edge portion of the element region,
the conductive wiring is disposed so as to cover at least a portion of an element termination region between the n type drain contact region and the p type element isolation region,
in the element termination region, an n type contact region for the conductive wiring is formed in a surface layer portion of the n type semiconductor layer, and the conductive wiring is electrically connected to the n type contact region via a conductive member.

2. The semiconductor device according to claim 1, comprising:
a drain wiring that is electrically connected to the n type drain contact region; and
wherein the drain wiring has an extension portion that extends into the element termination region in plan view, and
the conductive wiring is constituted of the extension portion.

3. The semiconductor device according to claim 2, wherein the n type drain contact region and the drain wiring are respectively formed in annular shapes in plan view, and
the extension portion is formed over an entire length of the drain wiring so as to surround the n type drain contact region in plan view.

4. The semiconductor device according to claim 1, wherein the n type drain contact region is formed in an annular shape in plan view, and
the n type contact region and the conductive wiring are respectively formed in annular shapes so as to surround the n type drain contact region in plan view.

5. The semiconductor device according to claim 1, comprising:
a drain wiring that is electrically connected to the n type drain contact region;
wherein the conductive wiring is connected to the drain wiring via a conductive member.

6. The semiconductor device according to claim 5, wherein the conductive wiring is formed on the n type semiconductor layer via an insulating layer inside the element termination region,
the drain wiring has an overlapping portion that overlaps with a portion of the conductive wiring in plan view, and
a lower surface of the overlapping portion and an upper surface of the conductive wiring are electrically connected by the conductive member.

7. The semiconductor device according to claim 6, wherein the n type drain contact region and the drain wiring are formed in annular shapes in plan view,
the conductive wiring is formed in an annular shape so as to surround the n type drain contact region in plan view,
the drain wiring has the overlapping portion at an outer peripheral edge portion thereof, and
the lower surface of the overlapping portion and an inner peripheral edge portion of the upper surface of the conductive wiring are electrically connected by the conductive member.

8. The semiconductor device according to claim 5, wherein the conductive wiring is constituted of polysilicon.

9. The semiconductor device according to claim 1, wherein an n type embedded layer is formed in a central portion of the element region in plan view so as to cross over a boundary between the p type substrate and the n type semiconductor layer.

10. The semiconductor device according to claim 1, wherein the p type element isolation region is formed in an annular shape that surrounds the element region in plan view, and
the n type drain contact region is formed in an annular shape along the p type element isolation region in plan view.

11. A semiconductor device comprising:
a base body that includes a p type substrate and an n type semiconductor layer formed on the p type substrate and includes an element region having a transistor with the n type semiconductor layer as a drain;
a p type element isolation region that is formed in a surface layer portion of the base body so as to demarcate the element region; and
a conductive wiring that is disposed on a peripheral edge portion of the element region and is electrically connected to the n type semiconductor layer;
wherein
the transistor includes an n type drain contact region that is formed in a surface layer portion of the n type semiconductor layer in the peripheral edge portion of the element region, and
the conductive wiring is disposed so as to cover at least a portion of an element termination region between the n type drain contact region and the p type element isolation region, and
wherein the transistor further includes a p type well region that is formed in a surface layer portion of the n type semiconductor layer,
an n type source region that is formed in a surface layer portion of the p type well region,
an n type source contact region that is formed in a surface layer portion of the n type source region and is higher in n type impurity concentration than the n type source region, and
an n type drain region that is formed in the surface layer portion of the n type semiconductor layer to have an annular shape so as to surround the p type well region, and
wherein the n type drain contact region is formed in a surface layer portion of the n type drain region so as to surround the p type well region and is higher in n type impurity concentration than the n type drain region.

12. The semiconductor device according to claim 11, wherein
the transistor further includes
a gate insulating film that is formed so as to cover a channel region between the source contact region and the drain contact region, and
a gate electrode that is formed on the gate insulating film and opposes the channel region via the gate insulating film.

13. The semiconductor device according to claim 11, comprising:
a source wiring that is electrically connected to the n type source contact region.

* * * * *